US009494628B1

United States Patent

Maharyta

(10) Patent No.: US 9,494,628 B1

(45) Date of Patent: Nov. 15, 2016

(54) METHODS AND CIRCUITS FOR MEASURING MUTUAL AND SELF CAPACITANCE

(71) Applicant: Parade Technologies, Ltd., Santa Clara, CA (US)

(72) Inventor: Andriy Maharyta, Lviv (UA)

(73) Assignee: PARADE TECHNOLOGIES, LTD., Santa Clara, CA (US)

(*) Notice: Subject to any disclaimer, the term of this patent is extended or adjusted under 35 U.S.C. 154(b) by 222 days.

(21) Appl. No.: 14/037,098

(22) Filed: Sep. 25, 2013

Related U.S. Application Data

(63) Continuation of application No. 13/664,421, filed on Oct. 31, 2012, now Pat. No. 8,570,052, which is a continuation of application No. 12/606,147, filed on Oct. 26, 2009, now Pat. No. 8,319,505, which is a continuation-in-part of application No. 12/395,462, filed on Feb. 27, 2009, now Pat. No. 8,358,142.

(60) Provisional application No. 61/108,450, filed on Oct. 24, 2008, provisional application No. 61/067,539, filed on Feb. 27, 2008.

(51) Int. Cl.

*G01R 27/26* (2006.01)
*H03M 1/12* (2006.01)

(52) U.S. Cl.

CPC ............ *G01R 27/2605* (2013.01); *H03M 1/12* (2013.01)

(58) Field of Classification Search

CPC .. G01R 27/26; G01R 27/2605; G01R 31/28; G01D 5/24; G06F 3/44; G06F 3/416; G06F 3/418; G06F 3/4883

See application file for complete search history.

(56) References Cited

U.S. PATENT DOCUMENTS 3,660,801 A 5/1972 Paulfus
3,921,167 A 11/1975 Fox (Continued)

FOREIGN PATENT DOCUMENTS

EP 0574213 A 12/1993
GB 05000604 2/2005

(Continued)

OTHER PUBLICATIONS

SIPO Office Action for Application No. 200880120802.9 dated Jan. 29, 2014; 5 pages.

(Continued)

*Primary Examiner* — Minh N Tang

(74) *Attorney, Agent, or Firm* — Morgan, Lewis & Bockius LLP

(57) ABSTRACT

An embodiment of a capacitance measurement circuit may include multiple switches, a first node coupled with a first electrode and coupled with at least a first switch of the multiple switches, and a second node coupled with a second electrode and coupled with at least a second switch of the multiple switches, where the multiple switches are configured to reduce an influence of a self-capacitance of the first electrode and a self-capacitance of the second electrode on an output signal during measurement of a mutual capacitance between the first electrode and the second electrode, and where the multiple switches are configured to reduce an influence of the mutual capacitance on the output signal during measurement of at least one of the self-capacitance of the first electrode and the self-capacitance of the second electrode.

16 Claims, 18 Drawing Sheets voltage buffer 1401
$C_{m}$ 103
$C_{e2}$ 102
$C_{e1}$ 101
$I_s$
$C_{fb}$ 1302
$V_{ref}$
operational amplifier 1301
$U_s$
ADC 1202

(56) References Cited

U.S. PATENT DOCUMENTS 3,979,745 A 9/1976 Bishop
4,039,940 A 8/1977 Buller et al.
4,090,092 A 5/1978 Serrano
4,103,252 A 7/1978 Bobick
4,113,378 A 9/1978 Wirtz
4,145,748 A 3/1979 Eichelberger et al.
4,193,063 A 3/1980 Hitt et al.
4,238,711 A 12/1980 Wallot
4,264,903 A 4/1981 Bigelow
4,266,144 A 5/1981 Bristol
4,283,713 A 8/1981 Philipp
4,292,604 A 9/1981 Embree et al.
4,293,734 A 10/1981 Pepper
4,305,135 A 12/1981 Dahl et al.
4,438,404 A 3/1984 Philipp
4,475,151 A 10/1984 Philipp
4,497,575 A 2/1985 Philipp
4,558,274 A 12/1985 Carusillo
4,560,830 A 12/1985 Perl
4,586,260 A 5/1986 Baxter et al.
4,614,937 A 9/1986 Poujois
4,686,332 A 8/1987 Greanias et al.
4,728,932 A 3/1988 Atherton
4,736,097 A 4/1988 Philipp
4,736,191 A 4/1988 Matzke et al.
4,742,331 A 5/1988 Barrow et al.
4,772,983 A 9/1988 Kerber et al.
4,773,024 A 9/1988 Faggin et al.
4,802,103 A 1/1989 Faggin et al.
4,825,147 A 4/1989 Cook et al.
4,831,325 A 5/1989 Watson, Jr.
4,876,534 A 10/1989 Mead et al.
4,878,013 A 10/1989 Andermo
4,879,461 A 11/1989 Philipp
4,879,505 A 11/1989 Barrow et al.
4,879,508 A 11/1989 Andermo
4,908,574 A 3/1990 Rhoades et al.
4,920,399 A 4/1990 Hall
4,935,702 A 6/1990 Mead et al.
4,940,980 A 7/1990 Tice
4,953,928 A 9/1990 Anderson et al.
4,962,342 A 10/1990 Mead et al.
4,977,480 A 12/1990 Nishihara
5,008,497 A 4/1991 Asher
5,049,758 A 9/1991 Mead et al.
5,055,827 A 10/1991 Philipp
5,059,920 A 10/1991 Anderson et al.
5,068,622 A 11/1991 Mead et al.
5,073,759 A 12/1991 Mead et al.
5,083,044 A 1/1992 Mead et al.
5,089,757 A 2/1992 Wilson
5,095,284 A 3/1992 Mead
5,097,305 A 3/1992 Mead et al.
5,107,149 A 4/1992 Platt et al.
5,109,261 A 4/1992 Mead et al.
5,119,038 A 6/1992 Anderson et al.
5,120,996 A 6/1992 Mead et al.
5,122,755 A 6/1992 Nootbaar et al.
5,122,800 A 6/1992 Philipp
5,126,685 A 6/1992 Platt et al.
5,146,106 A 9/1992 Anderson et al.
5,160,899 A 11/1992 Anderson et al.
5,165,054 A 11/1992 Platt et al.
5,166,562 A 11/1992 Allen et al.
5,204,549 A 4/1993 Platt et al.
5,214,388 A 5/1993 Vranish et al.
5,237,879 A 8/1993 Speeter
5,243,554 A 9/1993 Allen et al.
5,248,873 A 9/1993 Allen et al.
5,260,592 A 11/1993 Mead et al.
5,270,963 A 12/1993 Allen et al.
5,276,407 A 1/1994 Mead et al.
5,281,862 A 1/1994 Ma
5,289,023 A 2/1994 Mead
5,294,889 A 3/1994 Heep et al.
5,303,329 A 4/1994 Mead et al.
5,305,017 A 4/1994 Gerpheide
5,323,158 A 6/1994 Ferguson
5,324,958 A 6/1994 Mead et al.
5,331,215 A 7/1994 Allen et al.
5,336,936 A 8/1994 Allen et al.
5,339,213 A 8/1994 O'Callaghan
5,349,303 A 9/1994 Gerpheide
5,365,461 A 11/1994 Stein et al.
5,373,245 A 12/1994 Vranish
5,374,787 A 12/1994 Miller et al.
5,381,515 A 1/1995 Platt et al.
5,384,467 A 1/1995 Plimon et al.
5,386,219 A 1/1995 Greanias et al.
5,408,194 A 4/1995 Steinbach et al.
5,412,387 A 5/1995 Vincelette et al.
5,424,756 A 6/1995 Ho et al.
5,461,321 A 10/1995 Sanders et al.
5,479,103 A 12/1995 Kernahan et al.
5,488,204 A 1/1996 Mead et al.
5,495,077 A 2/1996 Miller et al.
5,518,078 A 5/1996 Tsujioka et al.
5,525,980 A 6/1996 Jahier et al.
5,541,580 A 7/1996 Gerston et al.
5,541,878 A 7/1996 LeMoncheck et al.
5,543,588 A 8/1996 Bisset et al.
5,543,590 A 8/1996 Gillespie et al.
5,543,591 A 8/1996 Gillespie et al.
5,555,907 A 9/1996 Philipp
5,565,658 A 10/1996 Gerpheide et al.
5,566,702 A 10/1996 Philipp
5,572,205 A 11/1996 Caldwell et al.
5,589,856 A 12/1996 Stein et al.
5,629,891 A 5/1997 LeMoncheck et al.
5,642,134 A 6/1997 Ikeda
5,648,642 A 7/1997 Miller et al.
5,650,597 A 7/1997 Redmayne
5,670,915 A 9/1997 Cooper et al.
5,672,959 A 9/1997 Der
5,680,070 A 10/1997 Anderson et al.
5,682,032 A 10/1997 Philipp
5,684,487 A 11/1997 Timko
5,691,513 A 11/1997 Yamamoto et al.
5,694,063 A 12/1997 Burlison et al.
5,730,165 A 3/1998 Philipp
5,748,185 A 5/1998 Stephan et al.
5,757,368 A 5/1998 Gerpheide et al.
5,760,852 A 6/1998 Wu et al.
5,763,909 A 6/1998 Mead et al.
5,763,924 A 6/1998 Lum et al.
5,767,457 A 6/1998 Gerpheide et al.
5,790,107 A 8/1998 Kasser et al.
5,796,183 A 8/1998 Hourmand
5,801,340 A 9/1998 Peter
5,812,698 A 9/1998 Platt et al.
5,825,352 A 10/1998 Bisset et al.
5,841,078 A 11/1998 Miller et al.
5,844,256 A 12/1998 Higashino
5,844,265 A 12/1998 Mead et al.
5,854,625 A 12/1998 Frisch et al.
5,861,583 A 1/1999 Schediwy et al.
5,861,875 A 1/1999 Gerpheide
5,864,242 A 1/1999 Allen et al.
5,864,392 A 1/1999 Winklhofer et al.
5,880,411 A 3/1999 Gillespie et al.
5,889,236 A 3/1999 Gillespie et al.
5,905,489 A 5/1999 Takahama et al.
5,914,465 A 6/1999 Allen et al.
5,914,708 A 6/1999 LaGrange et al.
5,920,309 A 7/1999 Bisset et al.
5,920,310 A 7/1999 Faggin et al.
5,926,566 A 7/1999 Wang et al.
5,942,733 A 8/1999 Allen et al.
5,943,052 A 8/1999 Allen et al.
5,949,264 A 9/1999 Lo
5,969,513 A 10/1999 Clark
6,023,422 A 2/2000 Allen et al.
6,028,271 A 2/2000 Gillespie et al.
6,028,959 A 2/2000 Wang et al.

(56) References Cited

U.S. PATENT DOCUMENTS 6,037,929 A 3/2000 Ogura et al.
6,037,930 A 3/2000 Wolfe et al.
6,060,957 A 5/2000 Kodrnja et al.
6,067,019 A 5/2000 Scott
6,097,432 A 8/2000 Mead et al.
6,140,853 A 10/2000 Lo
6,145,850 A 11/2000 Rehm
6,148,104 A 11/2000 Wang et al.
6,184,871 B1 2/2001 Teres et al.
6,185,450 B1 2/2001 Seguine et al.
6,188,228 B1 2/2001 Philipp
6,188,391 B1 2/2001 Seely et al.
6,191,723 B1 2/2001 Lewis
6,222,528 B1 4/2001 Gerpheide et al.
6,239,389 B1 5/2001 Allen et al.
6,249,447 B1 6/2001 Boylan et al.
6,262,717 B1 7/2001 Donohue et al.
6,271,719 B1 8/2001 Sevastopoulos
6,271,720 B1 8/2001 Sevastopoulos
6,271,835 B1 8/2001 Hoeksma
6,278,283 B1 8/2001 Tsugai
6,280,391 B1 8/2001 Olson et al.
6,288,707 B1 9/2001 Philipp
6,295,052 B1 9/2001 Kato et al.
6,304,014 B1 10/2001 England et al.
6,320,184 B1 11/2001 Winklhofer et al.
6,323,846 B1 11/2001 Westerman et al.
6,326,859 B1 12/2001 Goldman et al.
6,342,817 B1 1/2002 Crofts et al.
6,344,773 B1 2/2002 Sevastopoulos et al.
6,353,200 B1 3/2002 Schwankhart
6,366,099 B1 4/2002 Reddi
6,377,009 B1 4/2002 Philipp
6,377,129 B1 4/2002 Rhee et al.
6,380,929 B1 4/2002 Platt
6,380,931 B1 4/2002 Gillespie et al.
6,400,217 B1 6/2002 Bhandari
6,414,671 B1 7/2002 Gillespie et al.
6,424,338 B1 7/2002 Anderson
6,430,305 B1 8/2002 Decker
6,441,073 B1 8/2002 Tanaka et al.
6,441,682 B1 8/2002 Vinn et al.
6,445,257 B1 9/2002 Cox et al.
6,448,911 B1 9/2002 Somayajula
6,449,195 B1 9/2002 Min et al.
6,452,514 B1 9/2002 Philipp
6,457,355 B1 10/2002 Philipp
6,459,321 B1 10/2002 Belch
6,459,424 B1 10/2002 Resman
6,466,036 B1 10/2002 Philipp
6,473,069 B1 10/2002 Gerpheide
6,476,798 B1 11/2002 Bertram et al.
6,489,899 B1 12/2002 Ely et al.
6,490,203 B1 12/2002 Tang
6,498,720 B2 12/2002 Glad
6,499,359 B1 12/2002 Washeleski et al.
6,522,083 B1 2/2003 Roach
6,522,128 B1 2/2003 Ely et al.
6,522,187 B1 2/2003 Sousa
6,523,416 B2 2/2003 Takagi et al.
6,529,015 B2 3/2003 Nonoyama et al.
6,534,970 B1 3/2003 Ely et al.
6,535,200 B2 3/2003 Philipp
6,570,557 B1 5/2003 Westerman et al.
6,574,095 B2 6/2003 Suzuki
6,577,140 B1 6/2003 Wenman
6,583,632 B2 6/2003 Von Basse et al.
6,587,093 B1 7/2003 Shaw et al.
6,597,347 B1 7/2003 Yasutake
6,610,936 B2 8/2003 Gillespie et al.
6,614,313 B2 9/2003 Crofts et al.
6,624,640 B2 9/2003 Lund et al.
6,639,586 B2 10/2003 Gerpheide
6,642,857 B1 11/2003 Schediwy et al.
6,649,924 B1 11/2003 Philipp et al.
6,667,740 B2 12/2003 Ely et al.
6,673,308 B2 1/2004 Hino et al.
6,677,758 B2 1/2004 Maki et al.
6,677,932 B1 1/2004 Westerman
6,680,731 B2 1/2004 Gerpheide et al.
6,683,462 B2 1/2004 Shimizu
6,690,066 B1 2/2004 Lin et al.
6,700,392 B2 3/2004 Haase
6,704,005 B2 3/2004 Kato et al.
6,705,511 B1 3/2004 Dames et al.
6,714,817 B2 3/2004 Daynes et al.
6,720,777 B2 4/2004 Wang
6,730,863 B1 5/2004 Gerpheide et al.
6,731,121 B1 5/2004 Hsu et al.
6,744,258 B2 6/2004 Ishio et al.
6,750,852 B2 6/2004 Gillespie et al.
6,753,801 B2 6/2004 Rossi
6,768,420 B2 7/2004 McCarthy et al.
6,774,644 B2 8/2004 Eberlein
6,781,577 B2 8/2004 Shigetaka
6,788,221 B1 9/2004 Ely et al.
6,788,521 B2 9/2004 Nishi
6,798,218 B2 9/2004 Kasperkovitz
6,803,905 B1 10/2004 Capps et al.
6,806,693 B1 10/2004 Bron
6,809,275 B1 10/2004 Cheng et al.
6,810,442 B1 10/2004 Lin et al.
6,825,673 B1 11/2004 Yamaoka
6,825,890 B2 11/2004 Matsufusa
6,829,727 B1 12/2004 Pawloski
6,838,887 B2 1/2005 Denen et al.
6,839,052 B1 1/2005 Kramer
6,856,433 B2 2/2005 Hatano et al.
6,859,159 B2 2/2005 Michalski
6,861,961 B2 3/2005 Sandbach et al.
6,873,203 B1 3/2005 Latham, II et al.
6,879,215 B1 4/2005 Roach
6,879,930 B2 4/2005 Sinclair et al.
6,882,338 B2 4/2005 Flowers
6,888,536 B2 5/2005 Westerman et al.
6,888,538 B2 5/2005 Ely et al.
6,891,531 B2 5/2005 Lin
6,893,724 B2 5/2005 Lin et al.
6,897,673 B2 5/2005 Savage et al.
6,903,402 B2 6/2005 Miyazawa
6,904,570 B2 6/2005 Foote et al.
6,914,547 B1 7/2005 Swaroop et al.
6,933,873 B1 8/2005 Horsley et al.
6,940,291 B1 9/2005 Ozick
6,946,853 B2 9/2005 Gifford et al.
6,949,811 B2 9/2005 Miyazawa
6,949,937 B2 9/2005 Knoedgen
6,958,594 B2 10/2005 Redl et al.
6,969,978 B2 11/2005 Dening
6,970,120 B1 11/2005 Bjornsen
6,970,126 B1 11/2005 McCartney
6,975,123 B1 12/2005 Malang et al.
6,993,607 B2 1/2006 Philipp
6,999,009 B2 2/2006 Monney
7,002,557 B2 2/2006 Iizuka et al.
7,006,078 B2 2/2006 Kim
7,006,938 B2 2/2006 Laraia et al.
7,030,782 B2 4/2006 Ely et al.
7,030,860 B1 4/2006 Hsu et al.
7,031,886 B1 4/2006 Hargreaves
7,032,051 B2 4/2006 Reay et al.
7,036,096 B1 4/2006 Sarkar et al.
7,046,230 B2 5/2006 Zadesky et al.
7,050,927 B2 5/2006 Sinclair et al.
7,068,039 B2 6/2006 Parker
7,075,316 B2 7/2006 Umeda et al.
7,075,864 B2 7/2006 Kakitsuka et al.
7,078,916 B2 7/2006 Denison
7,084,645 B1 8/2006 Umeda et al.
7,098,675 B2 8/2006 Inaba et al.
7,109,978 B2 9/2006 Gillespie et al.
7,119,550 B2 10/2006 Kitano et al.
7,129,714 B2 10/2006 Baxter
7,129,935 B2 10/2006 Mackey

(56) References Cited

U.S. PATENT DOCUMENTS 7,133,140 B2 11/2006 Lukacs et al.
7,133,793 B2 11/2006 Ely et al.
7,136,051 B2 11/2006 Hein et al.
7,141,968 B2 11/2006 Hibbs et al.
7,141,987 B2 11/2006 Hibbs et al.
7,148,704 B2 12/2006 Philipp
7,151,276 B2 12/2006 Gerlach et al.
7,151,528 B2 12/2006 Taylor et al.
7,158,056 B2 1/2007 Wright et al.
7,158,125 B2 1/2007 Sinclair et al.
7,202,655 B2 4/2007 Itoh
7,202,857 B2 4/2007 Hinckley et al.
7,205,777 B2 4/2007 Schulz et al.
7,212,189 B2 5/2007 Shaw et al.
7,224,591 B2 5/2007 Kaishita et al.
7,225,090 B2 5/2007 Coley
7,233,508 B2 6/2007 Itoh
7,235,983 B2 6/2007 McCartney et al.
7,245,131 B2 7/2007 Kurachi et al.
7,253,643 B1 8/2007 Seguine
7,254,775 B2 8/2007 Geaghan et al.
7,256,588 B2 8/2007 Howard et al.
7,262,609 B2 8/2007 Reynolds
7,271,608 B1 9/2007 Vermeire et al.
7,288,946 B2 10/2007 Hargreaves et al.
7,288,977 B2 10/2007 Stanley
7,298,124 B2 11/2007 Kan et al.
7,301,350 B2 11/2007 Hargreaves et al.
7,307,485 B1 12/2007 Snyder et al.
7,312,616 B2 12/2007 Snyder
7,323,879 B2 1/2008 Kuo et al.
7,333,090 B2 2/2008 Tanaka et al.
7,339,580 B2 3/2008 Westerman et al.
7,359,816 B2 4/2008 Kumar et al.
7,375,535 B1 5/2008 Kutz et al.
7,378,810 B1 5/2008 Sutardja et al.
7,381,031 B2 6/2008 Kawaguchi et al.
7,392,431 B2 6/2008 Swoboda
7,406,393 B2 7/2008 Ely et al.
7,417,411 B2 8/2008 Hoffman et al.
7,417,441 B2 8/2008 Reynolds
7,423,437 B2 9/2008 Hargreaves et al.
7,439,962 B2 10/2008 Reynolds et al.
7,449,895 B2 11/2008 Ely et al.
7,450,113 B2 11/2008 Gillespie et al.
7,451,050 B2 11/2008 Hargreaves
7,453,270 B2 11/2008 Hargreaves et al.
7,453,279 B2 11/2008 Corbin et al.
7,466,307 B2 12/2008 Trent, Jr. et al.
7,479,788 B2 1/2009 Bolender et al.
7,495,659 B2 2/2009 Marriott et al.
7,499,040 B2 3/2009 Zadesky et al.
7,504,833 B1 3/2009 Seguine
7,515,140 B2 4/2009 Philipp
7,521,941 B2 4/2009 Ely et al.
RE40,867 E 8/2009 Binstead
7,598,752 B2 10/2009 Li
7,598,822 B2 10/2009 Rajagopal et al.
7,656,168 B2 2/2010 Mahowald et al.
7,663,607 B2 2/2010 Hotelling et al.
7,667,468 B1 2/2010 Anderson
7,683,641 B2 3/2010 Hargreaves et al.
7,804,307 B1 9/2010 Bokma et al.
7,812,827 B2 10/2010 Hotelling et al.
7,812,829 B2 10/2010 Gillespie et al.
7,821,274 B2 10/2010 Philipp et al.
7,831,070 B1 11/2010 Cheng et al.
7,855,718 B2 12/2010 Westerman
7,868,874 B2 1/2011 Reynolds
7,911,456 B2 3/2011 Gillespie et al.
7,932,897 B2 4/2011 Elias et al.
8,040,142 B1 10/2011 Bokma et al.
8,040,321 B2 10/2011 Peng et al.
8,049,732 B2 11/2011 Hotelling et al.
8,054,299 B2 11/2011 Krah
8,059,015 B2 11/2011 Hua et al.
8,067,948 B2 11/2011 Sequine
8,068,097 B2 11/2011 Guang
8,072,429 B2 12/2011 Grivna
8,082,566 B2 12/2011 Stallings
8,089,288 B1 1/2012 Maharita
8,089,289 B1 1/2012 Kremin et al.
8,093,914 B2 1/2012 Maharyta et al.
8,094,128 B2 1/2012 Vu et al.
8,120,591 B2 2/2012 Krah et al.
8,144,125 B2 3/2012 Peng et al.
8,144,126 B2 3/2012 Wright
8,169,238 B1 5/2012 Maharyta et al.
8,248,084 B2 8/2012 Bokma et al.
8,358,142 B2 1/2013 Maharyta
8,400,406 B1 3/2013 Kurtz et al.
8,462,135 B1 6/2013 Xiao et al.
8,537,121 B2 9/2013 XiaoPing
8,542,211 B2 9/2013 Elias
8,692,563 B1 4/2014 Maharyta
2001/0012667 A1 8/2001 Ma et al.
2001/0048313 A1 12/2001 Frank
2002/0000978 A1 1/2002 Gerpheide
2002/0008543 A1 1/2002 Nasu et al.
2002/0063688 A1 5/2002 Shaw et al.
2002/0067348 A1 6/2002 Masters et al.
2002/0080014 A1 6/2002 Mccarthy et al.
2002/0109035 A1 8/2002 Denen et al.
2002/0136372 A1 9/2002 Bozorgui-Nesbat
2002/0140440 A1 10/2002 Haase
2002/0185981 A1 12/2002 Dietz et al.
2003/0014239 A1 1/2003 Ichbiah et al.
2003/0025679 A1 2/2003 Taylor et al.
2003/0058053 A1 3/2003 Jeon et al.
2003/0062889 A1 4/2003 Ely et al.
2003/0063073 A1 4/2003 Geaghan et al.
2003/0063428 A1 4/2003 Nishi
2003/0076306 A1 4/2003 Zadesky et al.
2003/0080755 A1 5/2003 Kobayashi
2003/0091220 A1 5/2003 Sato et al.
2003/0098858 A1 5/2003 Perski et al.
2003/0112021 A1 6/2003 Palaia et al.
2003/0156098 A1 8/2003 Shaw et al.
2003/0160808 A1 8/2003 Foote et al.
2003/0161278 A1 8/2003 Igura
2003/0178675 A1 9/2003 Nishizaka et al.
2003/0183864 A1 10/2003 Miyazawa
2003/0183884 A1 10/2003 Miyazawa
2003/0184315 A1 10/2003 Eberlein
2003/0189419 A1 10/2003 Maki et al.
2003/0230438 A1 12/2003 Keefer et al.
2003/0232507 A1 12/2003 Chen
2004/0041798 A1 3/2004 Kim
2004/0056845 A1 3/2004 Harkcom et al.
2004/0068409 A1 4/2004 Tanaka et al.
2004/0082198 A1 4/2004 Nakamura et al.
2004/0169594 A1 9/2004 Ely et al.
2004/0178989 A1 9/2004 Shahoian et al.
2004/0178997 A1 9/2004 Gillespie et al.
2004/0183560 A1 9/2004 Savage et al.
2004/0217945 A1 11/2004 Miyamoto et al.
2004/0239616 A1 12/2004 Collins
2004/0239650 A1 12/2004 Mackey
2004/0252109 A1 12/2004 Trent et al.
2004/0263864 A1 12/2004 Lukacs et al.
2005/0021269 A1 1/2005 Ely et al.
2005/0024341 A1 2/2005 Gillespie et al.
2005/0028330 A1 2/2005 Hsu
2005/0031175 A1 2/2005 Hara et al.
2005/0062732 A1 3/2005 Sinclair et al.
2005/0073302 A1 4/2005 Hibbs et al.
2005/0073322 A1 4/2005 Hibbs et al.
2005/0083110 A1 4/2005 Latham et al.
2005/0099188 A1 5/2005 Baxter
2005/0159126 A1 7/2005 Wang
2005/0169768 A1 8/2005 Kawaguchi et al.
2005/0179668 A1 8/2005 Edwards
2005/0270273 A1 12/2005 Marten
2005/0275382 A1 12/2005 Slessman et al.

(56) References Cited

U.S. PATENT DOCUMENTS

2005/0280639 A1 12/2005 Taylor et al.
2006/0012575 A1 1/2006 Knapp et al.
2006/0012580 A1 1/2006 Perski et al.
2006/0012581 A1 1/2006 Haim et al.
2006/0017701 A1 1/2006 Marten et al.
2006/0022660 A1 2/2006 Itoh
2006/0026535 A1 2/2006 Hotelling et al.
2006/0032680 A1 2/2006 Elias et al.
2006/0033508 A1 2/2006 Lee
2006/0033724 A1 2/2006 Chaudhri et al.
2006/0038793 A1 2/2006 Philipp
2006/0049834 A1 3/2006 Umeda
2006/0053387 A1 3/2006 Ording
2006/0062889 A1 3/2006 Houston et al.
2006/0066582 A1 3/2006 Lyon et al.
2006/0066585 A1 3/2006 Lin
2006/0097991 A1 5/2006 Hotelling et al.
2006/0097992 A1 5/2006 Gitzinger et al.
2006/0108349 A1 5/2006 Finley et al.
2006/0113974 A1 6/2006 Kan et al.
2006/0114247 A1 6/2006 Brown
2006/0119331 A1 6/2006 Jacobs et al.
2006/0132111 A1 6/2006 Jacobs et al.
2006/0139469 A1 6/2006 Yokota et al.
2006/0152739 A1 7/2006 Silvestre
2006/0164142 A1 7/2006 Stanley
2006/0172767 A1 8/2006 Cathey et al.
2006/0176718 A1 8/2006 Itoh
2006/0187214 A1 8/2006 Gillespie et al.
2006/0193156 A1 8/2006 Kaishita et al.
2006/0197750 A1 9/2006 Kerr et al.
2006/0197752 A1 9/2006 Hurst et al.
2006/0221061 A1 10/2006 Fry
2006/0227117 A1 10/2006 Proctor
2006/0232559 A1 10/2006 Chien et al.
2006/0238518 A1 10/2006 Westerman et al.
2006/0256090 A1 11/2006 Huppi
2006/0258390 A1 11/2006 Cui et al.
2006/0262101 A1 11/2006 Layton et al.
2006/0267953 A1 11/2006 Peterson et al.
2006/0273804 A1* 12/2006 Delorme .................. G01D 5/24 324/658
2006/0290678 A1 12/2006 Lii
2007/0046299 A1 3/2007 Hargreaves et al.
2007/0046651 A1 3/2007 Sinclair et al.
2007/0069274 A1 3/2007 Elsass et al.
2007/0074913 A1 4/2007 Geaghan et al.
2007/0076897 A1 4/2007 Philipp
2007/0100566 A1 5/2007 Coley
2007/0109274 A1 5/2007 Reynolds
2007/0132737 A1 6/2007 Mulligan et al.
2007/0143667 A1 6/2007 Deaton et al.
2007/0152977 A1 7/2007 Ng et al.
2007/0152983 A1 7/2007 McKillop et al.
2007/0164756 A1 7/2007 Lee
2007/0176609 A1 8/2007 Ely et al.
2007/0176903 A1 8/2007 Dahlin et al.
2007/0229468 A1 10/2007 Peng et al.
2007/0229469 A1 10/2007 Seguine
2007/0236478 A1 10/2007 Geaghan et al.
2007/0257894 A1 11/2007 Philipp
2007/0263191 A1 11/2007 Shibazaki
2007/0268243 A1 11/2007 Choo et al.
2007/0268265 A1 11/2007 Xiaoping
2007/0268273 A1 11/2007 Westerman et al.
2007/0268274 A1 11/2007 Westerman et al.
2007/0268275 A1 11/2007 Westerman et al.
2007/0273659 A1 11/2007 XiaoPing et al.
2007/0291013 A1 12/2007 Won
2007/0296709 A1 12/2007 GuangHai
2008/0007529 A1 1/2008 Paun et al.
2008/0007533 A1 1/2008 Hotelling
2008/0007534 A1 1/2008 Peng et al.
2008/0024455 A1 1/2008 Lee et al.
2008/0036473 A1 2/2008 Jansson
2008/0041639 A1 2/2008 Westerman et al.
2008/0041640 A1 2/2008 Gillespie et al.
2008/0042986 A1 2/2008 Westerman et al.
2008/0042987 A1 2/2008 Westerman et al.
2008/0042988 A1 2/2008 Westerman et al.
2008/0042989 A1 2/2008 Westerman et al.
2008/0042994 A1 2/2008 Gillespie et al.
2008/0047764 A1 2/2008 Lee et al.
2008/0048997 A1 2/2008 Gillespie et al.
2008/0062139 A1 3/2008 Hotelling et al.
2008/0062140 A1 3/2008 Hotelling et al.
2008/0062148 A1 3/2008 Hotelling et al.
2008/0068100 A1 3/2008 Goodnow et al.
2008/0072192 A1 3/2008 Lenahan
2008/0079699 A1 4/2008 Mackey
2008/0088595 A1 4/2008 Liu et al.
2008/0100280 A1 5/2008 Masson et al.
2008/0111714 A1 5/2008 Kremin
2008/0116904 A1 5/2008 Reynolds et al.
2008/0128182 A1 6/2008 Westerman et al.
2008/0150906 A1 6/2008 Grivna
2008/0158145 A1 7/2008 Westerman
2008/0158169 A1 7/2008 O'Connor et al.
2008/0158177 A1 7/2008 Wilson et al.
2008/0158178 A1 7/2008 Hotelling et al.
2008/0158183 A1 7/2008 Hotelling et al.
2008/0158184 A1 7/2008 Land et al.
2008/0162997 A1 7/2008 Vu et al.
2008/0165134 A1 7/2008 Krah
2008/0179112 A1 7/2008 Qin et al.
2008/0180399 A1 7/2008 Cheng
2008/0196945 A1 8/2008 Konstas
2008/0246723 A1 10/2008 Baumbach
2008/0250864 A1 10/2008 Shipton
2008/0266263 A1 10/2008 Motaparti et al.
2008/0277171 A1 11/2008 Wright
2008/0278178 A1 11/2008 Philipp
2008/0309623 A1 12/2008 Hotelling et al.
2008/0309634 A1 12/2008 Hotelling et al.
2009/0002206 A1 1/2009 Kremin
2009/0096758 A1 4/2009 Hotelling et al.
2009/0153152 A1 6/2009 Maharyta et al.
2009/0179838 A1 7/2009 Yamashita et al.
2009/0322351 A1 12/2009 Mcleod
2010/0001973 A1 1/2010 Hotelling et al.
2010/0006350 A1 1/2010 Elias
2010/0013791 A1 1/2010 Haga et al.
2010/0060608 A1 3/2010 Yousefpor
2010/0098257 A1 4/2010 Mueller
2010/0328256 A1 12/2010 Harada et al.
2010/0328262 A1 12/2010 Huang et al.
2011/0025629 A1 2/2011 Grivna et al.
2011/0133815 A1 6/2011 Caldwell et al.
2011/0156724 A1 6/2011 Bokma et al.
2011/0234523 A1 9/2011 Chang et al.
2012/0043140 A1 2/2012 Peterson et al.
2012/0043973 A1* 2/2012 Kremin .................. G06F 3/044 324/658
2012/0043976 A1 2/2012 Bokma et al.
2012/0327041 A1 12/2012 Harley et al.
2013/0049771 A1 2/2013 Peng et al.
2013/0162585 A1 6/2013 Schwartz
2013/0207906 A1 8/2013 Yousefpor et al.
2014/0266257 A1 9/2014 Maharyta

FOREIGN PATENT DOCUMENTS

JP 04012528 1/1992
JP 05283519 b1 10/1993
JP 6104334 A 4/1994
JP 6163528 A 6/1994
WO WO0002188 A 1/2000

OTHER PUBLICATIONS

TIPO Office Action for Application No. 097148538 dated Nov. 21, 2013; 2 pages.

(56) References Cited

OTHER PUBLICATIONS

"Sigma-Delta ADCs and DACs, AN-283 Application Note, Analog Devices," 1993; Downloaded from <http://www.analog.com/UpoloadedFiles/Application_Notes/292524291525717245054923680458171 AN283.pdf>; 16 pages.
"The Virtual Keyboard: I-Tech Bluetooth/Serial Virtual Laser Keyboard Available Now!" The Virtual Laser Keyboard (VKB) Online Worldwide Shop, <http://www.virtual-laser-keyboard.com>, downloaded Apr. 13, 2006; 4 pages.
Andrew S. Tanenbaum with contributions from James R. Goodman, "Structured Computer Organization," 1999, Prentice Hall, Fourth Edition; 32 pages.
U.S. Appl. No. 13/049,798: "Capacitance to Code Converter With Sigma-Delta Modulator," Kremin, filed on Mar. 16, 2011; 77 pages.
U.S. Appl. No. 11/396,179: "Apparatus and Method for Reducing Average Scan Rate to Detect a Conductive Object on a Sensing Device" Tao Peng et al., filed on Mar. 30, 2006; 75 pages.
U.S. Appl. No. 11/493,350: "Technique for Increasing the Sensitivity of Capacitive Sensor Arrays," Lee et al., filed on Jul. 25, 2006; 48 pages.
U.S. Appl. No. 11/600,255: "Capacitance to Code Converter With Sigma-Delta Modulator," Kremin, filed on Nov. 14, 2006; 102 pages.
U.S. Appl. No. 11/709,866: "Input/Output Multiplexer Bus," Dennis R. Sequine, filed on Feb. 21, 2007; 33 pages.
U.S. Appl. No. 11/709,897: "Preventing Unintentional Activation Of A Sensor Element Of A Sensing Device" Jason Konstas et al., filed on Feb. 21, 2007; 97 pages.
U.S. Appl. No. 11/729,818: "Touch Detection Techniques for Capacitive Touch Sense Sysytems" Louis W. Bokma et al., filed on Mar. 28, 2007; 42 pages.
U.S. Appl. No. 11/801,115: "Reducing Sleep Current In a Capacitance Sensing System" David G. Wright et al., filed on May 7, 2007; 72 pages.
U.S. Appl. No. 11/823,982: "Capacitance Measurement Systems and Methods" Louis Bokma et al., filed on Jun. 29, 2007; 24 pages.
U.S. Appl. No. 12/040,387: "Touch Sensing," Peterson et al., filed on Feb. 29, 2008; 28 pages.
U.S. Appl. No. 12/166,228 "Capacitance to Frequency Converter," Andriy Maharyla et al., Filed on Jul. 1, 2008; 29 pages.
U.S. Appl. No. 12/197,466: "Radical Oxidation Process for Fabricating a Nonvolatile Charge Trap Memory Device," Ramkumar et al., filed on Aug. 25, 2008; 68 pages.
U.S. Appl. No. 12/239,692: "System and Method to Measure Capacitance of Capacitive Sensor Array" Nathan Mayal et al., filed on Sep. 26, 2008; 36 pages.
U.S. Appl. No. 12/332,980: "Compensation Circuit for a TX-RX Capacitive Sensor," Andriy Maharyta, filed on Dec. 11, 2008; 55 pages.
U.S. Appl. No. 12/380,141: "Capacitive Field Sensor With Sigma-Delta Modulator", Rystun et al., filed on Feb. 23, 2009, 48 pages.
U.S. Appl. No. 12/395,462: "Methods and Circuits for Measuring Mutual and Self Capacitance," Andriy Maharyla, filed on Feb. 27, 2009; 44 pages.
U.S. Appl. No. 12/395,959: "Multi-Touch Sensing Method" Dana Olson et al., filed on Mar. 2, 2009; 22 pages.
U.S. Appl. No. 12/606,147: "Methods and Circuits for Measuring Mutual and Self Capacitance," Andriy Maharyla, filed on Oct. 26, 2009; 49 pages.
U.S. Appl. No. 12/618,661: "Automatic Tuning Of a Capacitive Sensing Device" Dana Olson, filed on Nov. 13, 2009; 30 pages.
U.S. Appl. No. 12/861,812: "Capacitance Measurement Systems and Methods" Louis Bokma et al., filed on Aug. 23, 2010; 24 pages.
U.S. Appl. No. 13/047,620: "Touch Detection Techniques for Capacitive Touch Sense Systems ", filed on Mar. 14, 2011, 38 pages.
U.S. Appl. No. 13/191,806: "Capacitance Measurement Systems and Methods", filed Jul. 27, 2011, 38 pages.
U.S. Appl. No. 13/306,840: "Input/Output Multiplexer Bus," Dennis R. Seguine, filed on Nov. 29, 2011; 31 pages.
U.S. Appl. No. 13/342,942: "Capacitive Field Sensor With Sigma-Delta Modulator" filed Jan. 3, 2012; 41 pages.
U.S. Appl. No. 13/345,504: "Compensation Circuit for a TX-RX Capacitive Sensor" filed Jan. 6, 2012; 55 pages.
U.S. Appl. No. 13/720,861: "Methods and Circuits for Measuring Mutual and Self Capacitance" Andriy Maharyta et al., filed on Dec. 19, 2012; 38 pages.
U.S. Appl. No. 13/948,885: "Apparatus and Method for Reducing Average Scan Rate to Detect a Conductive Object on a Sensing Device" Tao Peng et al., filed on Jul. 23, 2013; 65 Pages.
U.S. Appl. No. 14/325,582: "Waterproof Scanning Of a Capacitance Sense Array" Michael Patrick Hiis et al., filed on Jul. 8, 2014; 41 pages.
U.S. Appl. No. 60/220,921: "Method for Automatically Tuning a Capacitive sensing Device" Dana Olson, filed on Jun. 26, 2009; 13 pages.
U.S. Appl. No. 60/947,865: "Capacitive Field Sensor with Sigma-Dell Modulator," Viktor Kremin, filed on Jul. 3, 2007; 33 pages.
U.S. Appl. No. 60/947,871: "Capacitance to Frequency Converter" Andrey Maharita et al., filed on Jul. 3, 2007; 21 pages.
U.S. Appl. No. 61/016,123 "Capacitive Field Sensor With Sigma-Delta Modulator" Filed on Dec. 21, 2007, 23 pages.
U.S. Appl. No. 61/023,988: "Touch Sensing" Jon Peterson, et al., Filed on Jan. 28, 2008; 26 pages.
U.S. Appl. No. 61/024, 158 "Multi-Touch Sensing Method With Differential Input" Dana Olson et al., filed on Jan. 28, 2008; 19 pages.
U.S. Appl. No. 61/030,526: "Capacitive Sensing Universal System and Method" Andriy Ryshtun., filed on Feb. 21, 2008; 22 pages.
U.S. Appl. No. 61/067,539 "Methods and Circuits for Measuring Mutual and Self Capacitance" Andriy Maharyta et al., filed on Feb. 27, 2008; 40 pages.
U.S. Appl. No. 61/067,743 "Multi-Touch Sensing Method with Differential Input" Dana Olson et al., filed on Feb. 29, 2008; 19 pages.
Chapweske, Adam; "The PS/2 Mouse Interface," PS/2 Mouse Interfacing, 2001, retrieved on May 18, 2006; 10 pages.
Chris Mack, "Semiconductor Lithography—The Basic Process," Gentleman Scientist, downloaded Apr. 20, 2006, http://www.lithoguru.com/scientist/lithobasics.html; 12 pages.
CSD User Module Data Sheet, Cypress Semiconductor Corporation CSD v 1.0, Oct. 23, 2006; 58 pages.
Cypress Semiconductor Corporation, "CY8C21x34 Data Sheet," CSR User Module, CSR V.1.0; Oct. 6, 2005; 36 pages.
Cypress Semiconductor Corporation, "Cypress Introduces PSoC(TM)-Based Capacitive Touch Sensor Solution," Cypress Press Release; May 31, 2005; <htlp://www.cypress.com/portal/server>; retrieved on Feb. 5, 2007; 4 pages.
Cypress Semiconductor Corporation, "FAN Controller CG6457AM and CG6462AM," PSoC Mixed Signal Array Preliminary Data Sheet; May 24, 2005; 25 pages.
Cypress Semiconductor Corporation, "PSoC CY8C20x34 Technical Reference Manual (TRM)," PSoC CY8C20x34 TRM, Version 1.0, 2006; 218 pages.
Cypress Semiconductor Corporation, "PSoC Mixed-Signal Controllers," Production Description; <http://www.cypress.com/portal/server>; retrieved on Sep. 27, 2005; 2 pages.
Cypress Semiconductor Corporation, "Release Notes srn017," Jan. 24, 2007; 3 pages.
Dennis Seguine, "Capacitive Switch Scan," Cypress Application Note AN2233a, Revision B, Apr. 14, 2005; 6 pages.
USPTO Notice of Allowance for U.S. Appl. No. 13/049,556 dated Nov. 7, 2014; 12 pages.
USPTO Notice of Allowance for U.S. Appl. No. 13/049,798 dated Jan. 30, 2015; 14 pages.
USPTO Notice of Allowance for U.S. Appl. No. 13/191,806 dated Jan. 30, 2015; 9 pages.
USPTO Notice of Allowance for U.S. Appl. No. 13/720,861 dated Jan. 30, 2014; 8 pages.
USPTO Notice of Allowance for U.S. Appl. No. 13/720,861 dated Dec. 3, 2013; 13 pages.
USPTO Notice of Allowance for U.S. Appl. No. 13/741,145 dated Feb. 23, 2015; 5 pages.

(56) References Cited

OTHER PUBLICATIONS

USPTO Notice of Allowance for U.S. Appl. No. 13/917,528 dated Feb. 4, 2015; 13 pages.
USPTO Notice of Allowance for U.S. Appl. No. 13/948,885 dated Jan. 12, 2015; 8 pages.
USPTO Notice of Allowance for U.S. Appl. No. 13/950,672 dated Mar. 4, 2015; 8 pages.
USPTO Notice of Allowance, U.S. Appl. No. 11/601,465, dated Apr. 22, 2010, 41 pages.
USPTO Notice of Allowance, U.S. Appl. No. 11/601,465, dated Jun. 28, 2011, 21 pages.
USPTO Notice of Allowance, U.S. Appl. No. 11/601,465, dated Aug. 10, 2010, 17 pages.
USPTO Notice of Allowance, U.S. Appl. No. 11/601,465, dated Nov. 26, 2010, 16 pages.
USPTO Notice of Allowance, U.S. Appl. No. 11/729,818, dated Jan. 26, 2011, 7 pages.
USPTO Notice of Allowance, U.S. Appl. No. 11/729,818, dated May 9, 2011, 8 pages.
USPTO Notice of Allowance, U.S. Appl. No. 11/729,818, dated Jun. 9, 2011, 8 pages.
USPTO Notice of Allowance, U.S. Appl. No. 11/729,818, dated Oct. 5, 2010, 7 pages.
USPTO Notice of Allowance, U.S. Appl. No. 11/729,818, dated Jun. 25, 2010, 7 pages.
USPTO Notice of Allowance, U.S. Appl. No. 13/047,620, dated Apr. 11, 2012, 19 pages.
USPTO Requirement for Restriction for U.S. Appl. No. 12/167,100 dated Aug. 20, 2010; 6 pages.
USPTO Requirement for Restriction for U.S. Appl. No. 12/239,692 dated Sep. 27, 2010; 7 pages.
USPTO Requirement for Restriction for U.S. Appl. No. 12/380,141 dated Jul. 8, 2011; 6 pages.
USPTO Requirement for Restriction for U.S. Appl. No. 12/395,462 dated May 13, 2011; 6 pages.
USPTO Requirement for Restriction/Election for U.S. Appl. No. 11/337,272 dated Sep. 11, 2006; 5 pages.
USPTO Requirement Restriction for U.S. Appl. No. 11/824,249 dated Feb. 17, 2011; 5 pages.
USPTO Restriction Requirement, U.S. Appl. No. 11/601,465, dated Nov. 1, 2007, 5 pages.
USPTO Restriction Requirement, U.S. Appl. No. 13/047,620, dated Feb. 27, 2012, 7 pages.
Van Ess, D., "Understanding Switched Capacitor Analog Blocs," AN2041, Application Note, Mar. 30, 2004, 16 pages.
Van Ess, David; "Simulating a 555 Timer with PSoC," Cypress Semiconductor Corporation, Application Note AN2286, May 19, 2005; 10 pages.
Vladislav Golub, Ph.D., "Sigma-Delta ADCs", pub. dale: Jun. 17, 2003, 10 pages.
Wikipedia, The Free Encyclopedia "IBM PC Keyboard" http://en.wikipedia.or/wiki/PC_keyboard>accessed May 19, 2006; 3 pages.
Written Opinion of the International Searching Authority for International Application No. PCT/US08/06627 mailed Aug. 26, 2008; 5 pages.
Written Opinion of the International Searching Authority for International Application No. PCT/US08/13622 mailed Feb. 9, 2009; 5 pages.
Written Opinion ofthe International Searching Authority for International Application No. PCT/US08/60696 mailed Sep. 22, 2008; 4 pages.
USPTO Final Rejection for U.S. Appl. No. 11/601,465 dated Jul. 9, 2008; 10 pages.
USPTO Final Rejection for U.S. Appl. No. 111709,897 dated Jul. 29, 2010; 24 pages.
USPTO Final Rejection for U.S. Appl. No. 111729,818 dated Jul. 2, 2009; 14 pages.
USPTO Final Rejection for U.S. Appl. No. 11/824,249 dated Dec. 22, 2011; 10 pages.
USPTO Final Rejection for U.S. Appl. No. 11/983,291 dated Aug. 12, 2009; 10 pages.
USPTO Final Rejection for U.S. Appl. No. 12/040,387 dated Nov. 21, 2011; 13 pages.
USPTO Final Rejection for U.S. Appl. No. 12/166,228 dated Jan. 4, 2011; 9 pages.
USPTO Final Rejection for U.S. Appl. No. 12/166,228 dated May 28, 2010; 12 pages.
USPTO Final Rejection for U.S. Appl. No. 12/239,692 dated May 9, 2011; 10 pages.
USPTO Final Rejection for U.S. Appl. No. 12/332,980 dated May 31, 2011; 11 pages.
USPTO Final Rejection for U.S. Appl. No. 12/367,279 dated Apr. 1, 2010; 6 pages.
USPTO Final Rejection for U.S. Appl. No. 12/395,462 dated Jan. 3, 2012; 6 pages.
USPTO Final Rejection for U.S. Appl. No. 12/395,969 dated Jul. 17, 2012; 25 pages.
USPTO Final Rejection for U.S. Appl. No. 12/861,812 dated Oct. 18, 2011; 10 pages.
USPTO Final Rejection for U.S. Appl. No. 13/670,671 dated May 11, 2015; 13 pages.
USPTO Final Rejection for U.S. Appl. No. 131720,861 dated May 14, 2013; 7 pages.
USPTO Final Rejection for U.S. Appl. No. 131720,861 dated Aug. 2, 2013; 9 pages.
USPTO Final Rejection for U.S. Appl. No. 131741,090 dated Jan. 22, 2015; 20 pages.
USPTO Final Rejection for U.S. Appl. No. 131741,145 dated Jan. 7, 2015; 23 pages.
USPTO Final Rejection for U.S. Appl. No. 14/275,387 dated Jan. 12, 2015; 16 pages.
USPTO Non Final Rejection for U.S. Appl. No. 11/600,255 dated Mar. 29, 2010; 10 pages.
USPTO Non Final Rejection for U.S. Appl. No. 11/823,982 dated Mar. 19, 2009; 14 pages.
USPTO Non Final Rejection for U.S. Appl. No. 12/166,228 dated Aug. 11, 2010; 8 pages.
USPTO Non Final Rejection for U.S. Appl. No. 12/199,228 dated Dec. 30, 2009; 11 pages.
USPTO Non Final Rejection for U.S. Appl. No. 12/380,141 dated Sep. 5, 2012; 6 pages.
USPTO Non Final Rejection for U.S. Appl. No. 13/191,806 dated Jul. 24, 2014; 19 pages.
USPTO Non Final Rejection for U.S. Appl. No. 13/670,671 dated Dec. 29, 2014; 8 pages.
USPTO Non Final Rejection for U.S. Appl. No. 131741,090 dated Apr. 2, 2015; 19 pages.
USPTO Non Final Rejection for U.S. Appl. No. 131741,090 dated Oct. 28, 2014; 18 pages.
USPTO Non Final Rejection for U.S. Appl. No. 131741,145 dated Oct. 29, 2014; 21 pages.
USPTO Non-Final Rejection for U.S. Appl. No. 09/975,105 dated Jan. 19, 2006; 5 pages.
USPTO Non-Final Rejection for U.S. Appl. No. 09/975,105 dated Apr. 19, 2005; 9 pages.
USPTO Non-Final Rejection for U.S. Appl. No. 11/230,719 dated Jan. 16, 2007; 8 pages.
USPTO Non-Final Rejection for U.S. Appl. No. 11/230,719 dated May 11, 2006; 5 pages.
USPTO Non-Final Rejection for U.S. Appl. No. 11/230,719 dated May 25, 2007; 6 pages.
USPTO Non-Final Rejection for U.S. Appl. No. 11/230,719 dated Aug. 28, 2006; 7 pages.
USPTO Non-Final Rejection for U.S. Appl. No. 11/273,708 dated Mar. 19, 2007; 16 pages.
USPTO Non-Final Rejection for U.S. Appl. No. 11/337,272 dated May 17, 2007; 11 pages.
USPTO Non-Final Rejection for U.S. Appl. No. 11/337,272 dated Oct. 24, 2006; 9 pages.
USPTO Non-Final Rejection for U.S. Appl. No. 11/395,417 dated Apr. 25, 2008; 7 pages.

(56) References Cited

OTHER PUBLICATIONS

USPTO Non-Final Rejection for U.S. Appl. No. 11/395,417 dated Oct. 26, 2006; 13 pages.
USPTO Non-Final Rejection for U.S. Appl. No. 11/395,417 dated Nov. 1, 2007; 8 pages.
USPTO Non-Final Rejection for U.S. Appl. No. 11/437,517 dated Aug. 3, 2010; 10 pages.
USPTO Non-Final Rejection for U.S. Appl. No. 11/437,517 dated Aug. 5, 2009; 9 pages.
USPTO Non-Final Rejection for U.S. Appl. No. 11/442,044 dated Mar. 31, 2009; 12 pages.
USPTO Non-Final Rejection for U.S. Appl. No. 11/442,212 dated Feb. 25, 2011; 13 pages.
USPTO Non-Final Rejection for U.S. Appl. No. 11/442,212 dated Jul. 6, 2010; 13 pages.
USPTO Non-Final Rejection for U.S. Appl. No. 11/477,179 dated Jun. 9, 2009; 13 pages.
USPTO Non-Final Rejection for U.S. Appl. No. 11/477,179 dated Jul. 20, 2010; 10 pages.
USPTO Non-Final Rejection for U.S. Appl. No. 11/477,179 dated Nov. 18, 2009; 10 pages.
USPTO Notice of Allowance for U.S. Appl. No. 11/600,255 dated Jul. 27, 2010; 6 pages.
USPTO Notice of Allowance for U.S. Appl. No. 11/601,465 dated Jan. 11, 2010; 18 pages.
USPTO Notice of Allowance for U.S. Appl. No. 11/601,465 dated Mar. 11, 2011; 17 pages.
USPTO Notice of Allowance for U.S. Appl. No. 11/601,465 dated May 8, 2009; 6 pages.
USPTO Notice of Allowance for U.S. Appl. No. 11/601,465 dated Sep. 10, 2009; 7 pages.
USPTO Notice of Allowance for U.S. Appl. No. 11/601,465 dated Oct. 7, 2011; 7 pages.
USPTO Notice of Allowance for U.S. Appl. No. 11/700,314 dated Sep. 16, 2010; 8 pages.
USPTO Notice of Allowance for U.S. Appl. No. 11/709,866 dated Feb. 16, 2010; 7 pages.
USPTO Notice of Allowance for U.S. Appl. No. 11/729,818 dated Feb. 24, 2010; 6 pages.
USPTO Notice of Allowance for U.S. Appl. No. 11/729,818 dated Nov. 13, 2009; 7 pages.
USPTO Notice of Allowance for U.S. Appl. No. 11/823,982 dated Feb. 1, 2010; 8 pages.
USPTO Notice of Allowance for U.S. Appl. No. 11/823,982 dated May 14, 2010; 8 pages.
USPTO Notice of Allowance for U.S. Appl. No. 11/823,982 dated Oct. 6, 2009; 12 pages.
USPTO Notice of Allowance for U.S. Appl. No. 11/880,963 dated Oct. 2, 2009; 4 pages.
USPTO Notice of Allowance for U.S. Appl. No. 11/983,291 dated Mar. 9, 2010; 7 pages.
USPTO Notice of Allowance for U.S. Appl. No. 11/983,291 dated Jun. 21, 2010; 7 pages.
USPTO Notice of Allowance for U.S. Appl. No. 11/983,291 dated Sep. 29, 2010; 7 pages.
USPTO Notice of Allowance for U.S. Appl. No. 11/983,291 dated Oct. 22, 2009; 7 pages.
USPTO Notice of Allowance for U.S. Appl. No. 12/040,387 dated Mar. 29, 2012; 8 pages.
USPTO Notice of Allowance for U.S. Appl. No. 12/166,228 dated Mar. 22, 2011; 8 pages.
USPTO Notice of Allowance for U.S. Appl. No. 12/167,100 dated Jan. 12, 2011; 8 pages.
USPTO Notice of Allowance for U.S. Appl. No. 12/167,100 dated Apr. 29, 2011; 8 pages.
USPTO Notice of Allowance for U.S. Appl. No. 12/167,100 dated Jun. 28, 2011; 8 pages.
USPTO Notice of Allowance for U.S. Appl. No. 12/167,100 dated Sep. 1, 2011; 8 pages.
USPTO Notice of Allowance for U.S. Appl. No. 12/167,100 dated Sep. 30, 2010; 7 pages.
USPTO Notice of Allowance for U.S. Appl. No. 12/239,692 dated Jan. 5, 2012; 8 pages.
USPTO Notice of Allowance for U.S. Appl. No. 12/239,692 dated May 16, 2012; 8 pages.
USPTO Notice of Allowance for U.S. Appl. No. 12/239,692 dated Jun. 25, 2012; 8 pages.
USPTO Notice of Allowance for U.S. Appl. No. 12/239,692 dated Aug. 15, 2012; 8 pages.
USPTO Notice of Allowance for U.S. Appl. No. 12/239,692 dated Sep. 18, 2012; 8 pages.
USPTO Notice of Allowance for U.S. Appl. No. 12/239,692 dated Oct. 13, 2011; 8 pages.
USPTO Notice of Allowance for U.S. Appl. No. 12/332,980 dated Oct. 4, 2011; 5 pages.
USPTO Notice of Allowance for U.S. Appl. No. 12/367,279 dated Aug. 23, 2010; 7 pages.
USPTO Notice of Allowance for U.S. Appl. No. 12/380,141 dated Jan. 26, 2012; 7 pages.
USPTO Notice of Allowance for U.S. Appl. No. 12/380,141 dated Apr. 10, 2012; 7 pages.
USPTO Notice of Allowance for U.S. Appl. No. 12/380,141 dated May 15, 2012; 7 pages.
USPTO Notice of Allowance for U.S. Appl. No. 12/380,141 dated Jun. 14, 2012; 8 pages.
USPTO Notice of Allowance for U.S. Appl. No. 12/380,141 dated Jul. 31, 2012; 5 pages.
USPTO Notice of Allowance for U.S. Appl. No. 12/395,462 dated May 4, 2012; 8 pages.
USPTO Notice of Allowance for U.S. Appl. No. 12/395,462 dated Jul. 20, 2012; 6 pages.
USPTO Notice of Allowance for U.S. Appl. No. 12/395,462 dated Aug. 29, 2012; 5 pages.
USPTO Notice of Allowance for U.S. Appl. No. 12/395,462 dated Oct. 2, 2012; 5 pages.
USPTO Notice of Allowance for U.S. Appl. No. 12/395,462 dated Nov. 14, 2012; 5 pages.
USPTO Notice of Allowance for U.S. Appl. No. 12/395,969 dated Mar. 23, 2015; 5 pages.
USPTO Notice of Allowance for U.S. Appl. No. 12/606,147 dated Aug. 13, 2012; 7 pages.
USPTO Notice of Allowance for U.S. Appl. No. 12/844,798 dated Feb. 25, 2015; 8 pages.
USPTO Notice of Allowance for U.S. Appl. No. 12/844,798 dated Oct. 7, 2014; 8 pages.
USPTO Notice of Allowance for U.S. Appl. No. 12/844,798 dated Dec. 16, 2014; 8 pages.
USPTO Non-Final Rejection for U.S. Appl. No. 11/484,085 dated Sep. 17, 2009; 8 pages.
USPTO Non-Final Rejection for U.S. Appl. No. 11/493,350 dated Jun. 16, 2010; 8 pages.
USPTO Non-Final Rejection for U.S. Appl. No. 11/493,350 dated Nov. 9, 2010; 9 pages.
USPTO Non-Final Rejection for U.S. Appl. No. 11/502,267 dated Aug. 11, 2008; 10 pages.
USPTO Non-Final Rejection for U.S. Appl. No. 11/512,042 dated Jul. 13, 2010; 14 pages.
USPTO Non-Final Rejection for U.S. Appl. No. 11/600,255 dated Mar. 29, 2010; 10 pages.
USPTO Non-Final Rejection for U.S. Appl. No. 11/600,896 dated May 14, 2010; 15 pages.
USPTO Non-Final Rejection for U.S. Appl. No. 11/600,896 dated Dec. 16, 2009; 13 pages.
USPTO Non-Final Rejection for U.S. Appl. No. 11/601,465 dated Oct. 2, 2008; 10 pages.
USPTO Non-Final Rejection for U.S. Appl. No. 11/601,465 dated Dec. 28, 2007; 16 pages.
USPTO Non-Final Rejection for U.S. Appl. No. 11/700,314 dated Mar. 26, 2010; 7 pages.
USPTO Non-Final Rejection for U.S. Appl. No. 11/709,897 dated Feb. 16, 2010; 21 pages.

(56) References Cited

OTHER PUBLICATIONS

USPTO Non-Final Rejection for U.S. Appl. No. 11/729,818 dated Dec. 17, 2008; 12 pages.
USPTO Non-Final Rejection for U.S. Appl. No. 11/824,249 dated Mar. 30, 2012; 10 pages.
USPTO Non-Final Rejection for U.S. Appl. No. 11/824,249 dated May 25, 2011; 9 pages.
USPTO Non-Final Rejection for U.S. Appl. No. 11/880,963 dated Jun. 12, 2009; 10 pages.
USPTO Non-Final Rejection for U.S. Appl. No. 11/967,243 dated Sep. 17, 2009; 9 pages.
USPTO Non-Final Rejection for U.S. Appl. No. 11/983,291 dated Mar. 9, 2009; 9 pages.
USPTO Non-Final Rejection for U.S. Appl. No. 12/040,387 dated Jun. 30, 2011; 12 pages.
USPTO Non-Final Rejection for U.S. Appl. No. 12/166,228 dated Aug. 11, 2010; 8 pages.
USPTO Non-Final Rejection for U.S. Appl. No. 12/166,228 dated Dec. 30, 2009; 11 pages.
USPTO Non-Final Rejection for U.S. Appl. No. 12/239,692 dated Nov. 29, 2010; 9 pages.
USPTO Non-Final Rejection for U.S. Appl. No. 12/332,980 dated Dec. 22, 2010; 9 pages.
USPTO Non-Final Rejection for U.S. Appl. No. 12/367,279 dated Oct. 29, 2009; 8 pages.
USPTO Non-Final Rejection for U.S. Appl. No. 12/380,141 dated Sep. 5, 2012; 6 pages.
USPTO Non-Final Rejection for U.S. Appl. No. 12/380,141 dated Sep. 19, 2011; 6 pages.
USPTO Non-Final Rejection for U.S. Appl. No. 12/395,462 dated Aug. 23, 2011; 5 pages.
USPTO Non-Final Rejection for U.S. Appl. No. 12/395,969 dated Dec. 16, 2011; 17 pages.
USPTO Non-Final Rejection for U.S. Appl. No. 12/606,147 dated Aug. 23, 2011; 6 pages.
USPTO Non-Final Rejection for U.S. Appl. No. 12/861,812 dated Apr. 15, 2011; 26 pages.
USPTO Non-Final Rejection for U.S. Appl. No. 13/590,390 dated Mar. 10, 2015; 14 pages.
USPTO Non-Final Rejection for U.S. Appl. No. 13/720,861 dated Mar. 11, 2013; 9 pages.
USPTO Non-Final Rejection for U.S. Appl. No. 13/948,885 dated Nov. 25, 2014; 10 pages.
USPTO Non-Final Rejection for U.S. Appl. No. 14/275,387 dated May 1, 2015; 19 pages.
USPTO Notice of Allowance for U.S. Appl. No. 09/975,105 dated Dec. 4, 2006; 4 pages.
USPTO Notice of Allowance for U.S. Appl. No. 09/986,338 dated Feb. 16, 2010; 4 pages.
USPTO Notice of Allowance for U.S. Appl. No. 10/888,666 dated Aug. 2, 2006; 11 pages.
USPTO Notice of Allowance for U.S. Appl. No. 11/230,719 dated Jan. 16, 2008; 4 pages.
USPTO Notice of Allowance for U.S. Appl. No. 11/273,708 dated Aug. 9, 2007; 4 pages.
USPTO Notice of Allowance for U.S. Appl. No. 11/337,272 dated Aug. 15, 2007; 9 pages.
USPTO Notice of Allowance for U.S. Appl. No. 11/395,417 dated Nov. 6, 2008; 7 pages.
USPTO Notice of Allowance for U.S. Appl. No. 11/484,085 dated Jun. 10, 2010; 4 pages.
USPTO Notice of Allowance for U.S. Appl. No. 11/489,944 dated Apr. 9, 2007; 7 pages.
USPTO Notice of Allowance for U.S. Appl. No. 11/489,944 dated May 24, 2007; 2 pages.
USPTO Notice of Allowance for U.S. Appl. No. 11/600,255 dated Apr. 12, 2012; 7 pages.
USPTO Notice of Allowance for U.S. Appl. No. 11/600,255 dated Apr. 20, 2011; 7 pages.
USPTO Notice of Allowance for U.S. Appl. No. 11/600,255 dated May 30, 2012; 7 pages.
USPTO Notice of Allowance for U.S. Appl. No. 11/600,255 dated Jun. 16, 2011; 7 pages.
USPTO Notice of Allowance for U.S. Appl. No. 11/600,255 dated Dec. 9, 2010; 6 pages.

* cited by examiner

| On | switch 402, switch 404 |
|---|---|
| Off | switch 403, switch 405 |

| On | switch 403, switch 405 |
|---|---|
| Off | switch 402, switch 404 |

METHODS AND CIRCUITS FOR MEASURING MUTUAL AND SELF CAPACITANCE

CROSS REFERENCE TO RELATED APPLICATION

This application is a continuation of U.S. patent application Ser. No. 13/664,421, filed Oct. 31, 2012, now U.S. Pat. No. 8,570,052, issued Nov. 29, 2013, which is a continuation of U.S. patent application Ser. No. 12/606,147, filed Oct. 26, 2009, now U.S. Pat. No. 8,319,505, issued Nov. 27, 2012, which claims the benefit of U.S. Provisional Patent Application No. 61/108,450, filed Oct. 24, 2008, and which is a continuation-in-part of U.S. patent application Ser. No. 12/395,462, filed Feb. 27, 2009, now U.S. Pat. No. 8,358, 142, issued Jan. 22, 2013, which claims the benefit of U.S. Provisional Patent Application No. 61/067,539, filed Feb. 27, 2008, all of which are incorporated by reference herein in their entirety.

TECHNICAL FIELD

The present disclosure relates generally to touch sensors and, more particularly, to capacitive touch sensors.

BACKGROUND

Capacitive touch sensors may be used to replace mechanical buttons, knobs and other similar mechanical user interface controls. The use of a capacitive sensor allows for the elimination of complicated mechanical switches and buttons, providing reliable operation under harsh conditions. In addition, capacitive sensors are widely used in modern customer applications, providing new user interface options in existing products.

BRIEF DESCRIPTION OF THE DRAWINGS

Embodiments are illustrated by way of example and are not intended to be limited by the figures of the accompanying drawings, in which like references indicate similar elements and in which.

DETAILED DESCRIPTION

Figure 1:
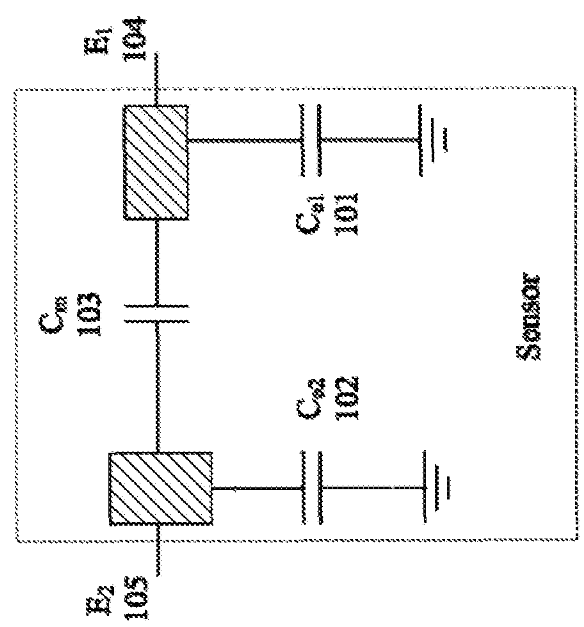
FIG. 1 illustrates two electrodes situated close to each other, according to one embodiment.

In the following description, for purposes of explanation, numerous specific details are set forth in order to provide a thorough understanding of embodiments of the present invention. It will be evident, however, to one skilled in the art that embodiments of the present invention may be practiced without these specific details. In other instances, well-known circuits, structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. Like reference numerals denote like references elements throughout.

A capacitive sensor may be characterized by a base capacitance that includes a self capacitance component and a mutual capacitance component. Since the values of these capacitance components affect the operation of the capacitive touch sensor and may vary from one capacitive sensor to another, a capacitive sensing circuit may benefit from the capability of independently measuring the self and mutual capacitances of a capacitive sensor.

Apparatus for and methods of measuring mutual and self capacitance in a capacitive touch sensor are described. The apparatus and methods described herein may be used in capacitive touch detection systems such as, for example, capacitive touch screens and, in particular, with capacitive touch screens having multiple simultaneous touch detection capabilities. Alternatively, the apparatus and methods described herein may be used with single touch detection systems or other types of capacitive touch systems.

The capacitance measurement circuits described herein may be used for touch detection in single electrode systems, transmit/receive (TX-RX) systems, or in combined TX-RX and single electrode systems. The TX-RX systems can use the mutual capacitance change detection, and single electrode systems can use the self capacitance change detection. In some embodiments, additional multiplexers can be added for multiple electrode scanning. In other embodiments additional capacitance-to-current converters may be added to allow parallel scanning of multiple sensor electrodes. The capacitance measurement circuits described herein may be used in various applications including, for example, single button applications, multiple buttons applications, linear and radial sliders, dual dimension touchpads and touchscreens, and multi-touch touchpad and touchscreen applications. Multi-touch touchpad and touchscreen systems are composed of a matrix of RX and TX electrodes, where the presence (e.g., touch) of a finger (or other conductive object) is detected as a decrease in the mutual capacitance at the intersection of the TX-RX electrodes.

Embodiments of the present invention allow for measurement of two or more 'electrodes' mutual and self capacitance separately. Capacitance measurement can be performed with a single pair of electrodes or with the use of a multiple electrode system. Two electrodes situated close to each other are shown at FIG. 1, where $C_{e1}$ 101 and $C_{e2}$ 102 are electrode self capacitances, and $C_m$ 103 is the mutual capacitance between the two electrodes $E_1$ 104 and $E_2$ 105.

Figure 2:
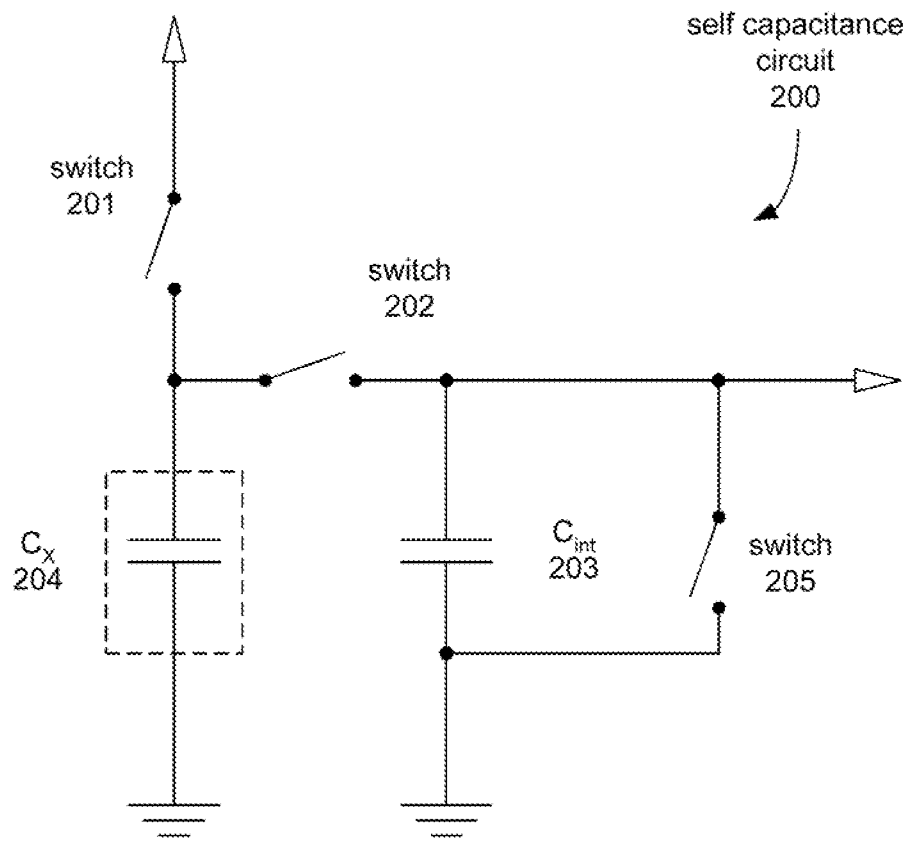
FIG. 2 illustrates one embodiment of a self-capacitance circuit that uses a charge accumulation technique.

There are various circuit implementations that may be used for performing capacitance measurement. FIG. 2 illustrates a self-capacitance circuit 200 that uses a charge accumulation technique to measure the capacitance $C_X$ 204. A charge accumulation technique operates in the following way: initially the integration capacitor 203 is reset by turning on a reset signal for some time which sets switch 205 such that both ends of integration capacitor 203 are grounded. After reset, the switches 201 and 202 start operation in the two non-overlapping phases, wherein switch 201 when closed accumulates charge onto $C_x$ and wherein switch 202 when closed allows that charged to be integrated onto $C_{int}$ 203. As more charge is integrated onto integration capacitor $C_{int}$ 203, the voltage on $C_{int}$ 203 starts increasing. The sensing capacitance may be determined by the number of switching cycles used to get the integrator capacitor voltage to some threshold value, such as $V_{DD}/2$ or a bandgap voltage ($V_{BG}$).

With such a charge accumulation technique, the voltage on the integration capacitance rises exponentially with respect to time (said time can be measured by a count of the number of cycle it takes to reach the threshold value). This relationship can be linearized for measurement methods where capacitance is calculated as a function of integration capacitor voltage after a predefined number of cycles. Also, the mutual capacitance measurement scheme has some sensitivity to the sensor self capacitance, which decreases the measurement accuracy.

Figure 3:
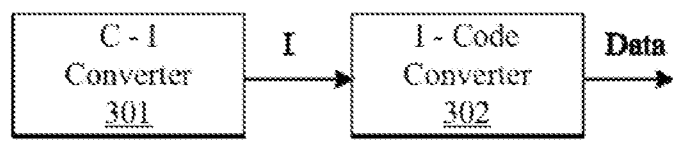
FIG. 3 illustrates a block diagram of an apparatus for measuring mutual or self capacitance, according to one embodiment.

FIG. 3 illustrates a block diagram of a capacitance measurement circuit 300 for measuring mutual or self capacitance, according to one embodiment of the present invention. The apparatus illustrated in FIG. 3 can be used for separately measuring mutual or self capacitances of a capacitance sensor. In order to measure a mutual capacitance, the $C_{e1}$, $C_{e2}$ (of FIG. 1) capacitance influence should be excluded. This can be accomplished by charging and discharging the $C_{e2}$ electrode from a low-impedance voltage source and keeping the voltage of the $C_{e1}$ electrode close to constant to minimize the influence of its charge-discharge current. In order to measure the self-capacitance (of $C_{e1}$ or $C_{e2}$) the voltage change across $C_m$ should be kept to zero to minimize the influence of this capacitance on the measurement results.

The capacitance measurement circuit 300 can be separated into two parts: the switching capacitor front-end capacitance-to-current converter 301, and the back-end current-to-digital value converter 302, as illustrated in FIG. 3. In the following description, the front-end and back-end circuits are described separately. A switching capacitor front-end converts the sensing capacitance to current pulses. The back-end system averages the current and converts it into readable digital values. The circuits described herein are based on a switching capacitor technique in capacitance-to-current converter circuits.

FIGS. 4A, 4B, 5A and 5B show different embodiments for a capacitance to current converter for mutual capacitance measurement. In the referenced figures, a voltage buffer 401 resides between the integration capacitor $C_{int}$ 406 and the switches 402, 404 connecting to the mutual electrodes of the capacitance-to-current. It should be noted that the integration capacitor $C_{int}$ 406 is considered as part of the current measurement system and shown here for ease of explanation. The integration capacitor 406 can be connected between the converter output and a fixed potential net, for example, GND and $V_{CC}$, as illustrated in FIGS. 4A, 4B, 5A and 5B, respectively.

The operation of the circuit may be described in several stages, which are repeated in cycle. Table 1 contains the switching sequence of switches for the circuits shown in FIGS. 4A and 4B.

TABLE 1

Figure 4A:
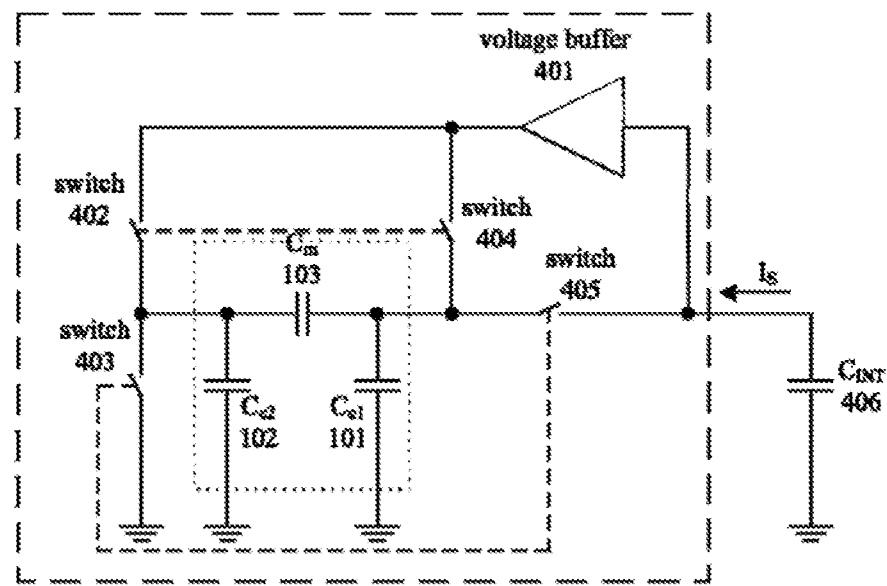
FIG. 4A illustrates one embodiment of a capacitance to current sink converter having an integration capacitor coupled to ground.
Figure 4B:
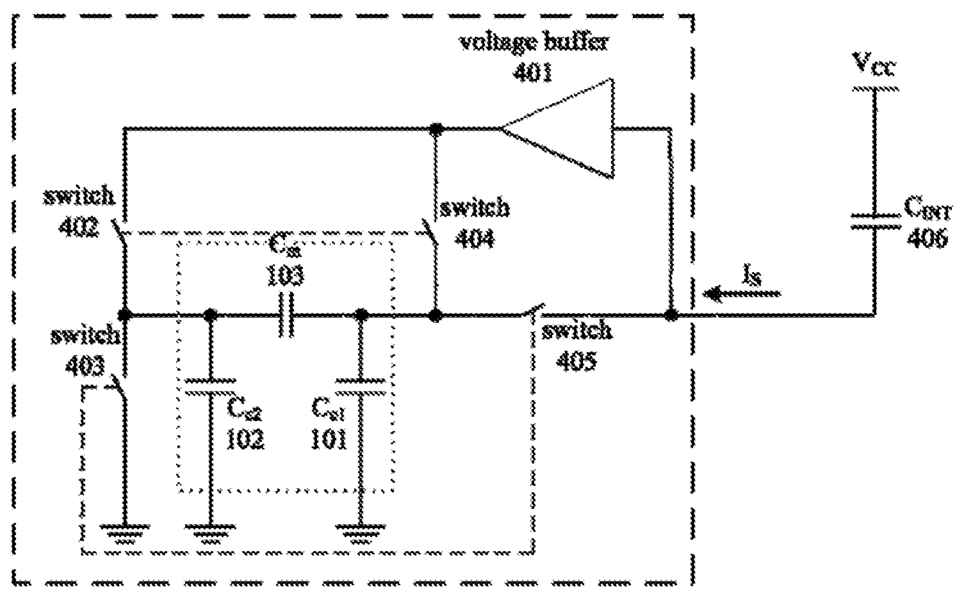
FIG. 4B illustrates one embodiment of a capacitance to current sink converter having an integration capacitor coupled to a high voltage supply potential.

Switching sequence of switches shown in FIGS. 4A and 4B.

| Stage | Switch 402 | Switch 403 | Switch 404 | Switch 405 | $U_{Cint}$, $U_{Ce1}$, $U_{Ce2}$, $U_{Cm}$ |
|---|---|---|---|---|---|
| 1 | OFF | OFF | OFF | OFF | $U_{Cint} = U_0$ |
| 2 | ON | OFF | ON | OFF | $U_{Cm} = 0$, $U_{Ce1} = U_{Ce2} = U_{Cint} = U_{buf}$ |
| 3 | OFF | OFF | OFF | OFF | $U_{Cm} = 0$, $U_{Ce1} = U_{Ce2} = U_{Cint}$ |
| 4 | OFF | ON | OFF | ON | $U_{Cm} = U_{Cint} = U_{Ce1}$, $U_{Ce2} = 0$ |
| 5 | OFF | OFF | OFF | OFF | $U_{Cm} = U_{Ce1}$, $U_{Ce2} = 0$ |

Figure 5A:
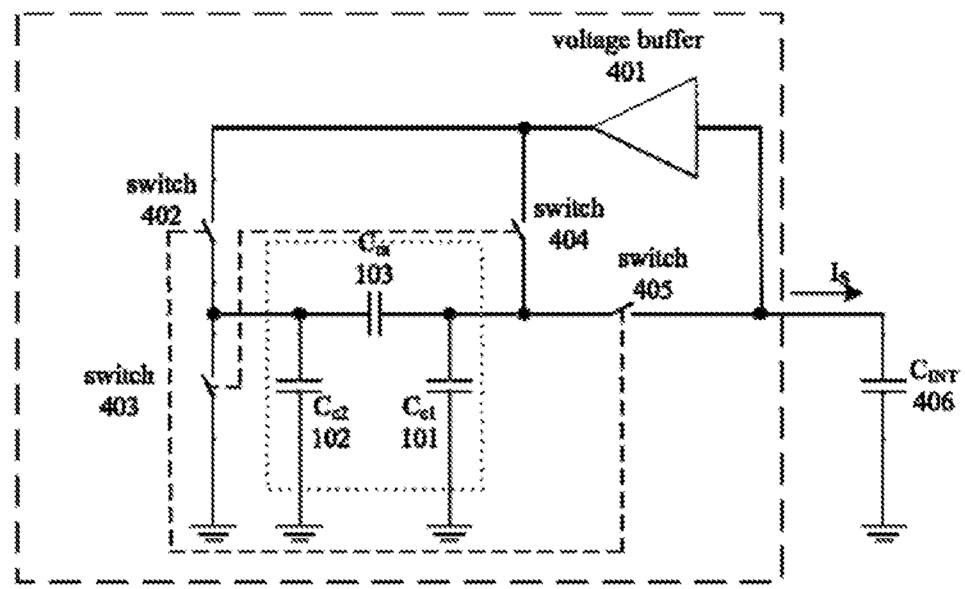
FIG. 5A illustrates one embodiment of a capacitance to current source converter having an integration capacitor coupled to ground.
Figure 5B:
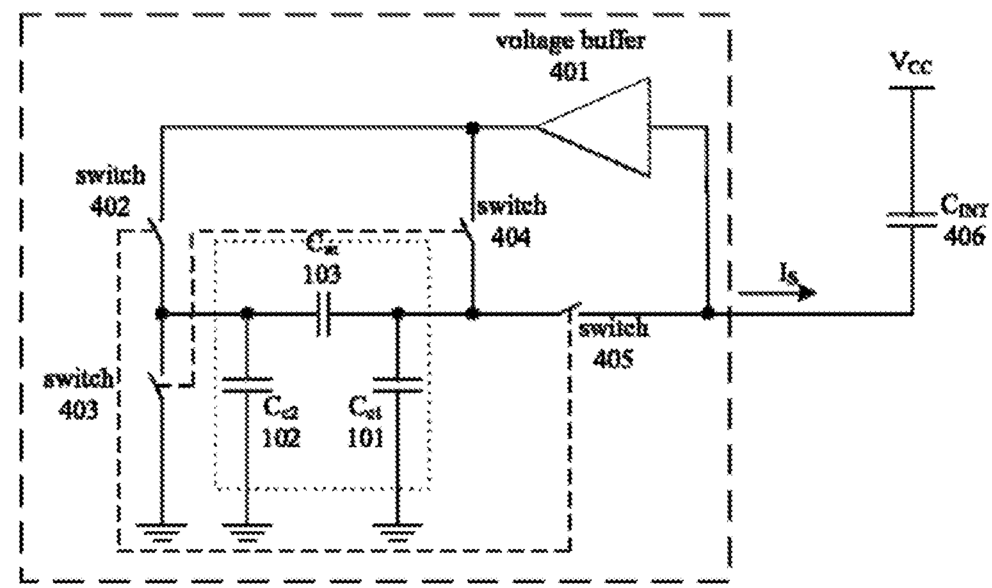
FIG. 5B illustrates one embodiment of a capacitance to current source converter having an integration capacitor coupled to a high voltage supply potential.

Table 2 contains the switching sequence of switches for the circuits shown in FIGS. 5A and 5B.

TABLE 2

Switching sequence of switches shown in FIGS. 5A and 5B.

| Stage | Switch 402 | Switch 403 | Switch 404 | Switch 405 | $U_{Cint}$, $U_{Ce1}$, $U_{Ce2}$, $U_{Cm}$ |
|---|---|---|---|---|---|
| 1 | OFF | OFF | OFF | OFF | $U_{Cint} = U_0$ |
| 2 | OFF | ON | ON | OFF | $U_{Cm} = U_{buf} = U_{Cint} = U_{Ce1}$ |
| 3 | OFF | OFF | OFF | OFF | $U_{Cm} = U_{Cint} = U_{Ce1}$ |
| 4 | ON | OFF | OFF | ON | $U_{Cm} = 0$, $U_{Ce1} = U_{Cint}$, $U_{Ce2} = U_{Cint}$ |
| 5 | OFF | OFF | OFF | OFF | $U_{Cm} = 0$, $U_{Ce1} = U_{Cint}$, $U_{Ce2} = U_{Cint}$ |

The stages from 2 to 5 are performed in cycles. In effect, the circuits shown in FIGS. 4A and 4B may act as current sinks, and the circuits shown in FIGS. 5A and 5B may act as current sources in the respective embodiment. The integration capacitor $C_{int}$ 406 is external to the capacitance-t0-current converter and is not part of the current measurement circuit.

Figure 6A:
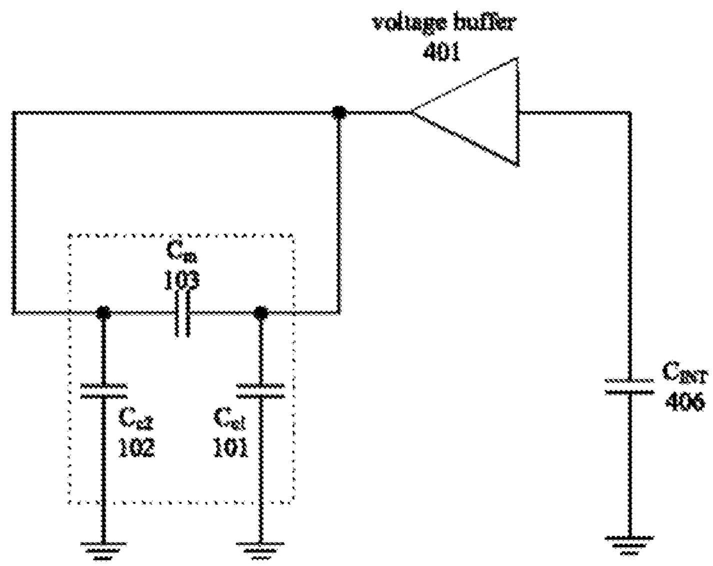
FIG. 6A illustrates a first phase of a converter operation, according to one embodiment.
Figure 6B:
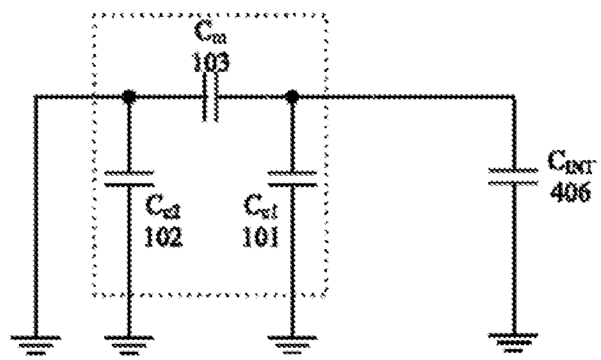
FIG. 6B illustrates a second phase of a converter operation, according to one embodiment.

FIGS. 6A and 6B illustrates one embodiment of the operation phases for the circuits shown in FIGS. 4A and 4B, respectively. During the first phase (FIG. 6A), both ends of the $C_m$ 103 are connected to voltage buffer 401. During the second phase (FIG. 6B), the left $C_m$ terminal is grounded and the right terminal is connected to the integration capacitor $C_m$, 406.

For both circuits, an averaged absolute current sink/source ($I_S$) value can be calculated by Equation 1:

$$I_S = f_{sw} \cdot U_{Cint} \cdot C_m \tag{1}$$

where, $f_{sw}$ is the switching frequency of phases 2-5 repeating. It should be noted that the capacitance of $C_{e2}$ electrode 102 is shunted by switch 402 or 403 in each operation phase and does not have an impact on the output current. The capacitance of the $C_{e1}$ electrode 101 has a potential equal to $U_{Cint}$ during both charge transfer stages and is not recharged between different operation phases. Therefore, the output current is determined by the value of $C_m$ 103 and the potential applied across it.

A special case of the capacitance-to-current converter operation is now considered, when it is loaded by standalone integration capacitor $C_{int}$ 406. In this case, the relationship between the voltage change on $U_{Cint}$ and the cycles count N has a nonlinear exponential character, as expressed in Equation 2:

$$U_{Cint}^N = U_{Cint}^0 \cdot \left(1 - \frac{C_m}{C_{int}}\right)^N \quad \left(U_{Cint}^N \approx U_{Cint}^0 \cdot e^{-N\frac{C_m}{C_{int}}}\right) \tag{2}$$

where, N is the quantity of conversion cycles and $U_{Cint}^0$ is the voltage on the integration capacitor 406 at the initial time.

The exponential character of this dependence is caused by the positive voltage feedback via buffer 401: increasing voltage on the integration capacitor 406 (when the capacitance-to-current converter is configured as a current source) causes a larger charge quantum being moved in each phase and an increase in the speed of the integration capacitor 406 voltage rising. The current measurement circuit may not keep a voltage on the integration capacitor 406 constant in this embodiment.

The circuit embodiments illustrated in FIGS. 7A, 7B, 8A, and 8B may be used to keep voltage on $C_{int}$ 406 constant. The difference between the circuit embodiments illustrated in FIGS. 7A, 7B, 8A, and 8B, versus those illustrated in FIGS. 4A, 4B, 5A, and 5B, is that the left terminal of $C_m$ 103 is connected to the fixed voltage source $V_{DD}$ in FIGS. 7A, 7B, 8A and 8B. In FIGS. 7A, 7B, 8A and 8B the variable buffer output voltage of an analog buffer 701 is coupled to the right terminal of $C_m$ 103 and in FIGS. 4A, 4B, 5A and 5B buffer 401 is coupled with the left terminal of $C_m$ 103. Only the switch 702 connection is changed on the circuits illustrated in FIGS. 7A, 7B, 8A, and 8B.

Figure 7A:
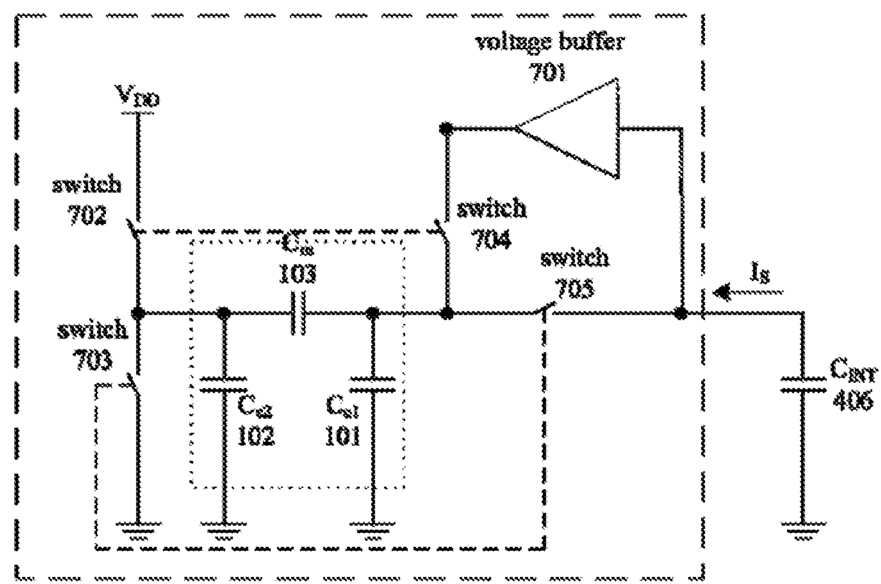
FIG. 7A illustrates one embodiment of a capacitance to current sink converter used for mutual capacitance measurement, having an integration capacitor coupled to ground.
Figure 7B:
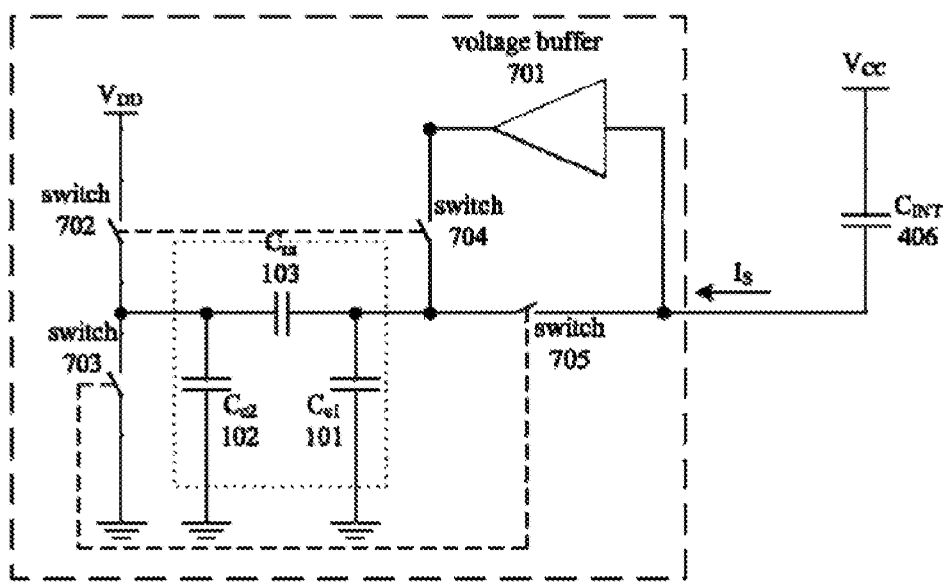
FIG. 7B illustrates one embodiment of a capacitance to current sink converter used for mutual capacitance measurement, having an integration capacitor coupled to $V_{DD}$.

The switching sequence of the switches illustrated in FIGS. 7A and 7B is shown in Table 3.

TABLE 3

Switching sequence of switches in FIGS. 7A and 7B.

| Stage | Switch 702 | Switch 703 | Switch 704 | Switch 705 | $U_{Cint}$, $U_{Ce1}$, $U_{Ce2}$, $U_{Cm}$ |
|---|---|---|---|---|---|
| 1 | OFF | OFF | OFF | OFF | $U_{Cint} = U_0$ |
| 2 | ON | OFF | ON | OFF | $-U_{Cm} = U_{Vdd} - U_{Cint}$, $U_{Ce1} = U_{Cint} = U_{buf}$, $U_{Ce2} = U_{Vdd}$ |
| 3 | OFF | OFF | OFF | OFF | $U_{Cm} = U_{Vdd} - U_{Cint}$, $U_{Ce1} = U_{Cint}$, $U_{Ce2} = U_{Vdd}$ |
| 4 | OFF | ON | OFF | ON | $U_{Cm} = U_{Cint} = U_{Ce1}$, $U_{Ce2} = 0$ |
| 5 | OFF | OFF | OFF | OFF | $U_{Cm} = U_{Ce1}$, $U_{Ce2} = 0$ |

Figure 8A:
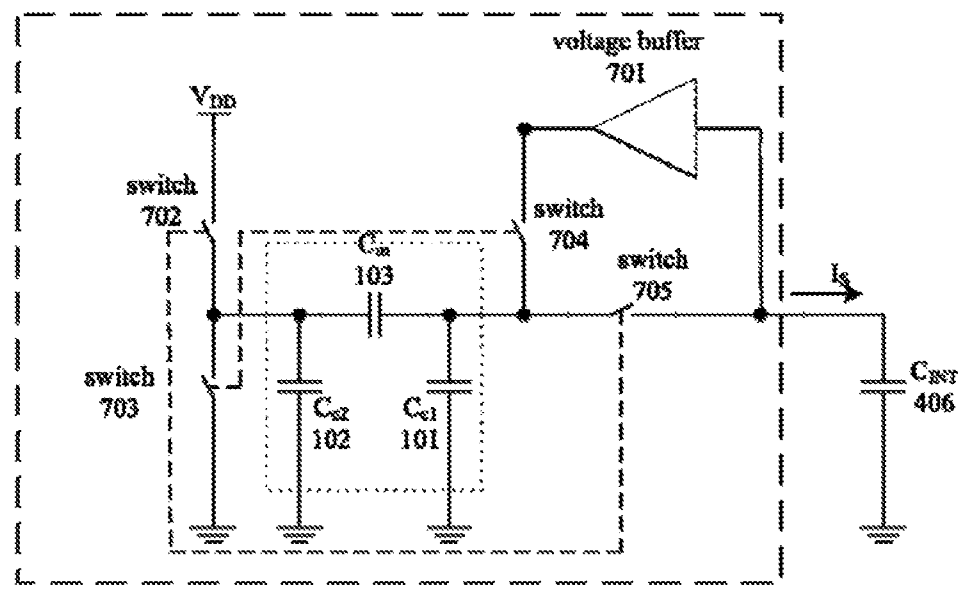
FIG. 8A illustrates one embodiment of a capacitance to current source converter having an integration capacitor coupled to ground.
Figure 8B:
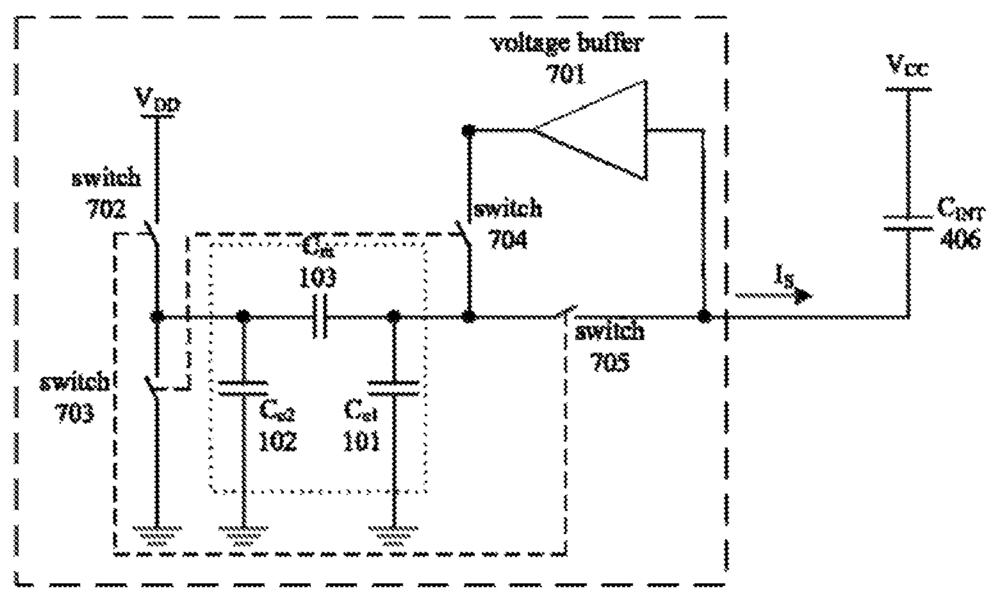
FIG. 8B illustrates one embodiment of a capacitance to current source converter having an integration capacitor coupled to a high voltage supply potential.

The switching sequence of the switches illustrated in FIGS. 8A and 8B is shown in Table 4.

TABLE 4

Switching sequence of switches in FIGS. 8a and 8b

| Stage | Switch 702 | Switch 703 | Switch 704 | Switch 705 | $U_{Cint}$, $U_{Ce1}$, $U_{Ce2}$, $U_{Cm}$ |
|---|---|---|---|---|---|
| 1 | OFF | OFF | OFF | OFF | $U_{Cint} = U_0$ |
| 2 | OFF | ON | ON | OFF | $U_{Cm} = U_{buf} = U_{Cint} = U_{Ce1}$ |
| 3 | OFF | OFF | OFF | OFF | $U_{Cm} = U_{Cint} = U_{Ce1}$ |
| 4 | ON | OFF | OFF | ON | $-U_{Cm} = U_{Vdd} - U_{Cint}$, $U_{Ce1} = U_{Cint}$, $U_{Ce2} = U_{Vdd}$ |
| 5 | OFF | OFF | OFF | OFF | $U_{Cm} = 0$, $U_{Ce1} = U_{Cint}$, $U_{Ce2} = U_{Vdd}$ |

The stages from 2 to 5 are performed in cycles. As a result, the average current flowing out of the $C_{int}$ 406 capacitor for the circuits on FIGS. 7A, 7B, 8A, and 8B may be calculated by Equation 3:

$$I_S = f_{sw} \cdot U_{Vdd} \cdot C_m \quad (3)$$

For the given values of $f_{sw}$ and $V_{DD}$ parameters, the output current ($I_S$) linearly depends on $C_m$ and is proportional to $f_{sw}$ and $V_{DD}$ in this embodiment. The change of current direction is done by a change of the switches' operation phases. If the current measurement subsystem does not load the integration capacitor $C_{int}$ 406, a voltage on this capacitor changes linearly with the number of cycles N, as expressed in Equation 4:

$$U_{Cint}^N = U_{Vdd} \cdot \left(1 - N \cdot \frac{C_m}{C_{int}}\right) \quad (4)$$

A similar Equation 5 is used for describing the circuits illustrated in FIGS. 8A and 8B:

$$U_N = N \cdot U_{Vdd} \cdot \frac{C_m}{C_{int}} \quad (5)$$

The mutual capacitance circuit embodiments described previously may be used for self-capacitance measurement with minimal hardware changes by routing the buffer signal to the left-side switches. To do this, the switched voltages may be adjusted in such a way that the voltage change on the mutual capacitance $C_m$ is equal to zero between different phases. In other circuit configurations, the voltage on $C_{e2}$ is kept constant but the voltage on $C_m$ is varied. In the circuit embodiments illustrated in FIGS. 7A, 7B, 8A, and 8B, the voltage on $C_{e2}$ is varied and the voltage change on $C_m$ is kept constant.

Figure 9A:
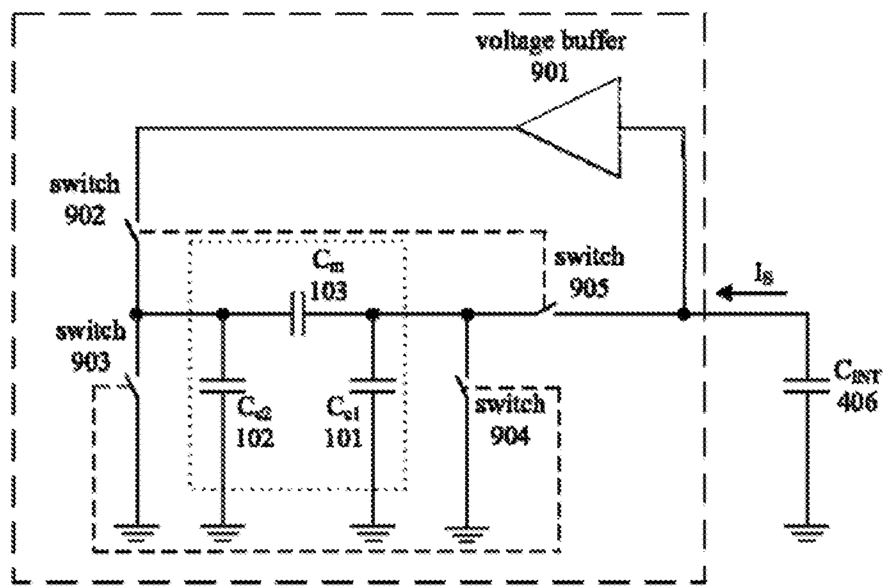
FIG. 9A illustrates one embodiment of a capacitance to current sink converter used for self capacitance measurement, having an integration capacitor coupled to ground.
Figure 9B:
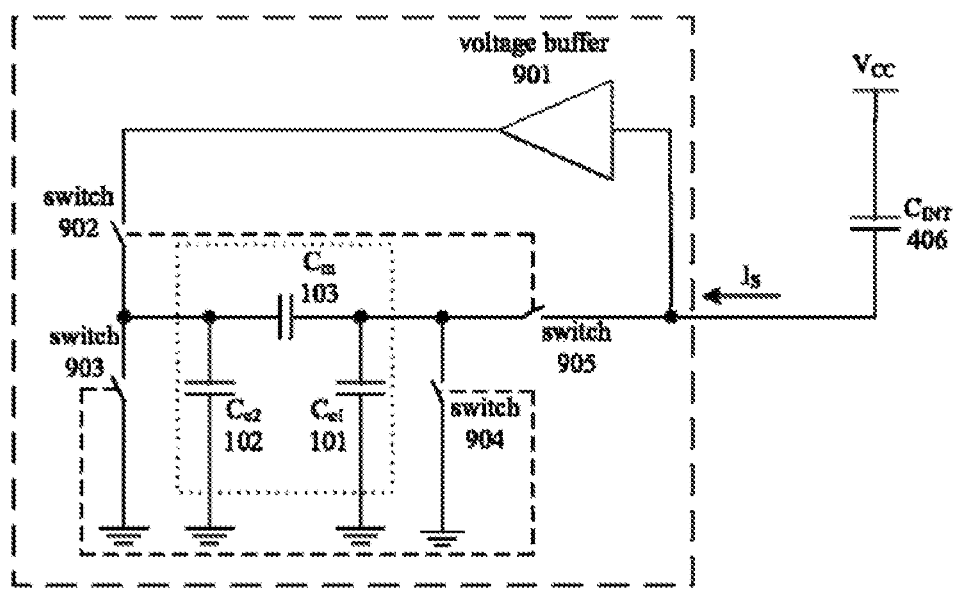
FIG. 9B illustrates one embodiment of a capacitance to current sink converter used for self capacitance measurement, having an integration capacitor coupled to a high voltage supply potential.

FIGS. 9A and 9B illustrate embodiments of a capacitance to current sink converter for self capacitance measurement. As previously noted, the integration capacitor $C_{int}$ 406 is considered part of the current measurement system and is shown here for ease of explanation. The integration capacitor 406 can be connected between the converter output and any fixed potential net, for example, GND and $V_{CC}$, as illustrated in FIGS. 9A and 9B respectively. Alternatively, the integration capacitor 406 can be connected between the converter output and other fixed potentials.

The switching sequence of switches illustrated in the circuit of FIGS. 9A and 9B is shown in Table 5.

TABLE 5

Switching sequence of switches illustrated in FIGS. 9A, 9B.

| Stage | Switch 902 | Switch 903 | Switch 904 | Switch 905 | $U_{Cint}$, $U_{Ce1}$, $U_{Ce2}$, $U_{Cm}$ |
|---|---|---|---|---|---|
| 1 | OFF | OFF | OFF | OFF | $U_{Cint} = U_0$ |
| 2 | OFF | ON | ON | OFF | $U_{Ce1} = U_{Ce2} = 0$, $U_{Cm} = 0$ |
| 3 | OFF | OFF | OFF | OFF | $U_{Ce1} = U_{Ce2} = 0$, $U_{Cm} = 0$ |
| 4 | ON | OFF | OFF | ON | $U_{e1} = U_{Cint} = U_{Ce2}$, $U_{Cm} = 0$ |
| 5 | OFF | OFF | OFF | OFF | $U_{e1} = U_{Cint} = U_{Ce2}$, $U_{Cm} = 0$ |

Figure 10A:
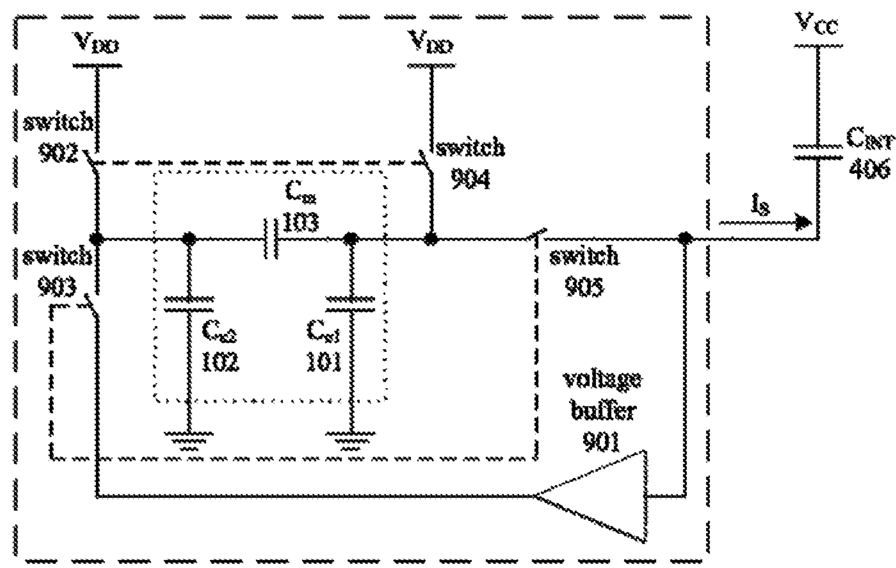
FIG. 10A illustrates one embodiment of a capacitance to current source converter used for self capacitance measurement, having an integration capacitor coupled to a high voltage supply potential.
Figure 10B:
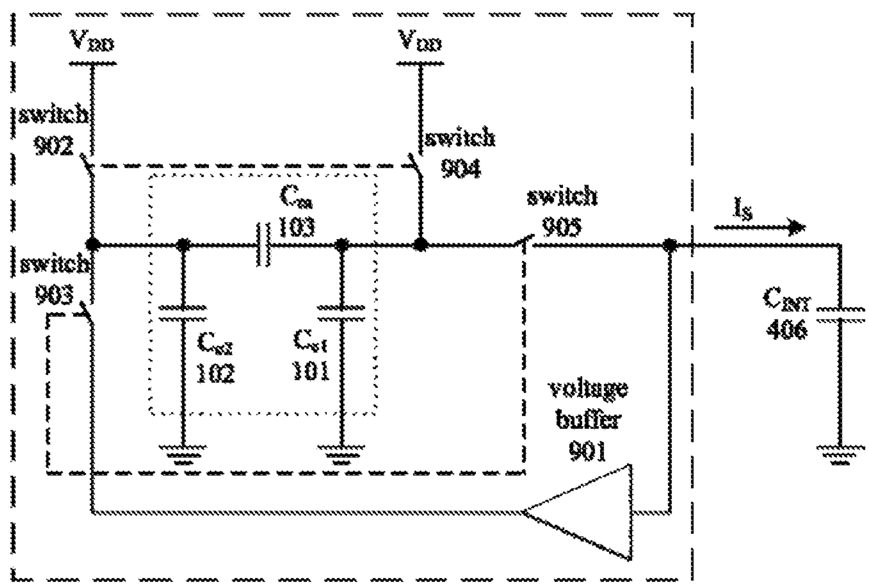
FIG. 10B illustrates one embodiment of a capacitance to current source converter used for self capacitance measurement, having an integration capacitor coupled to ground.

FIGS. 10A and 10B illustrate embodiments of a capacitance to current source converter for self capacitance measurement. As previously noted, the integration capacitor $C_{int}$ 406 is considered part of the current measurement system and is shown here for ease of explanation. The integration capacitor 406 can be connected between the converter output and any fixed potential net, for example, GND and $V_{CC}$, as illustrated in FIGS. 10A and 10B respectively. Alternatively, the integration capacitor 406 can be connected between the converter output and other fixed potentials.

The switching sequence of switches in FIGS. 10A and 10B is shown in Table 6.

TABLE 6

Switching sequence of switches illustrated in FIGS. 10A, 10B.

| Stage | Switch 902 | Switch 903 | Switch 904 | Switch 905 | $U_{Cint}$, $U_{Ce1}$, $U_{Ce2}$, $U_{Cm}$ |
|---|---|---|---|---|---|
| 1 | OFF | OFF | OFF | OFF | $U_{Cint} = U_0$ |
| 2 | ON | OFF | ON | OFF | $U_{Ce1} = U_{Ce2} = U_{Vdd}$, $U_{Cm} = 0$ |
| 3 | OFF | OFF | OFF | OFF | $U_{Ce1} = U_{Ce2} = U_{Vdd}$,, $U_{Cm} = 0$ |
| 4 | OFF | ON | OFF | ON | $U_{e1} = U_{Cint} = U_{Ce2}$, $U_{Cm} = 0$ |
| 5 | OFF | OFF | OFF | OFF | $U_{e1} = U_{Cint} = U_{Ce2}$, $U_{Cm} = 0$ |

Stages 2 through 5 are performed in cycles. As a result, the average current flowing out of capacitor $C_{int}$ for the circuits illustrated in FIGS. 9A and 9B may be described by Equation 6:

$$I_S = f_{sw} \cdot U_{Cint} \cdot C_{e1} \quad (6)$$

The average current flowing into $C_{int}$ capacitor for the circuits illustrated in FIGS. 10A and 10B may be described by Equation 7:

$$I_S = f_{sw} \cdot (U_{Vdd} - U_{Cint}) \cdot C_{e1} \quad (7)$$

The potential difference on electrode capacitor $C_m$ 103 is equal to approximately zero during the stages of charge transfer and does not have an impact on the measurement in this embodiment. The $C_{e2}$ electrode 102 capacitance is switched off by switches 902 and 904 during the stages of operation. In this case, the relationship between the voltage change on $U_{Cint}$ and the cycle count N has a nonlinear exponential character for the circuits illustrated in FIGS. 9A and 9B, in accord with Equation 8:

$$U_{Cint}^N = U_{Cint}^0 \cdot \left(1 - \frac{C_{e1}}{C_{int}}\right)^N \quad (8)$$

Equation 9 similarly describes the circuits illustrated in FIGS. 10A and 10B:

$$U_{Cint}^N = U_{Vdd} \cdot \left(1 - e^{-N \cdot \frac{C_{e1}}{C_{int}}}\right) \quad (9)$$

Various alternative variants of the conversion circuits described above may be used. Alternative conversion circuits include integration circuits such as time measurement of the integration capacitor voltage threshold crossing, current integrations with an operational amplifier as a current integrator. Alternative conversion circuits include analog-to-digital circuits such as a current-to-voltage conversion using an operational amplifier and an ADC voltage measurement device or sigma-delta modulation circuits.

Figure 11:
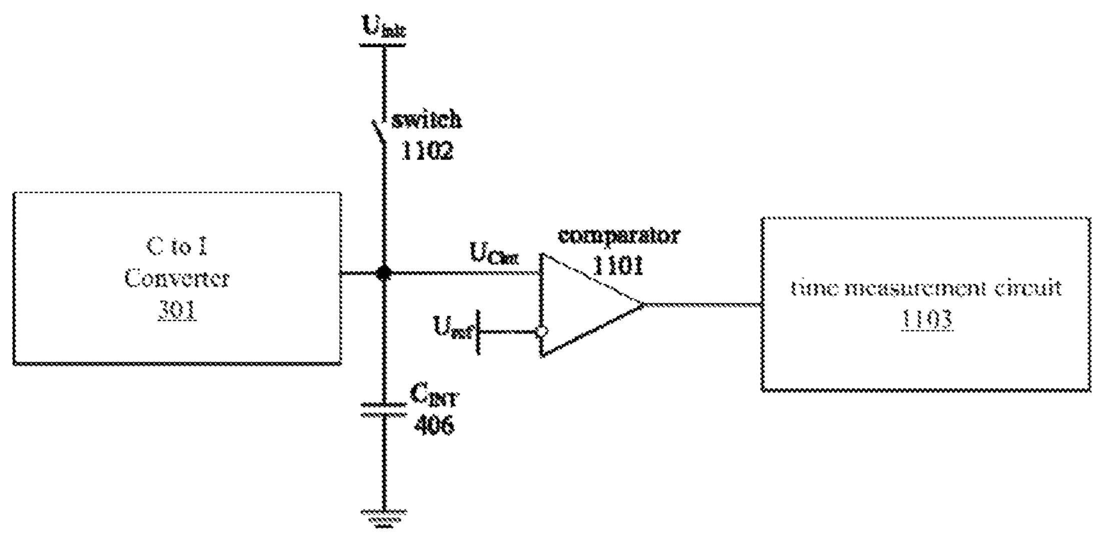
FIG. 11 illustrates one embodiment of an interval timer method for capacitance measurement.

FIG. 11 illustrates an interval timer method for capacitance measurement. In the circuit of FIG. 11, the integrator consists of a capacitor 406. The circuit of FIG. 11 operates in the following way. Initially, the voltage of integration capacitor 406 is set to $I_{init}$ by turning on, for some time period, a switch 1102. The comparator 1101 is used as threshold circuit and compares the voltage on the integration capacitor 406 with a reference voltage $U_{ref}$. The capacitance is measured by the time measurement circuit 1103 as the time elapsed (in the cycles count) until the comparator 1101 is triggered. The time is inversely proportional to the capacitance-to-current converter current in this embodiment. It should be noted that for switching capacitor current sink schemes, an integrator initial voltage ($U_{init}$) is set higher than the threshold voltage ($U_{ref}$). For the current source schemes, the integrator initial voltage is lower than threshold voltage $U_{ref}$.

Figure 12:
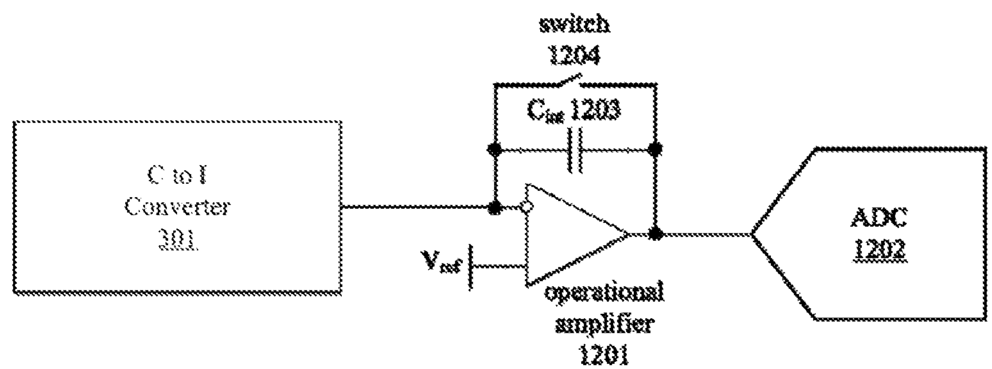
FIG. 12 illustrates one embodiment of a resettable current integrator with an operation amplifier and an analog-to-digital converter (ADC)
Figure 13:
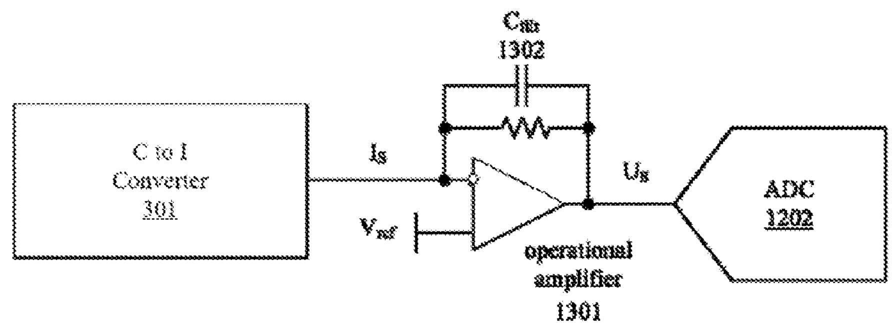
FIG. 13 illustrates one embodiment of a current-to-voltage converter built around an operational amplifier.

For more accurate current conversion, circuits based on current-to-voltage converters and current integrators may be used, as illustrated in FIGS. 12 and 13. FIG. 12 illustrates one embodiment of a resettable current integrator (where integration capacitor 1203 can be reset using switch 1204) with an operational amplifier 1201 with reference input voltage $V_{ref}$ and an analog-to-digital converter (ADC) 1202 coupled to the output of operational amplifier 1201. The ADC 1202 is used for integrator voltage measurement after the completion of a predefined number of integration cycles. Capacitance on the is converted to current by capacitance-to-current converter 301 and $C_{int}$ 1203 is charged with the output current to Vref on the operational amplifier 1201. The output of operational amplifier 1201 coupled to the opposite side of $C_{int}$ 1203 is then measured by ADC 1202 to calculate the value of the capacitance in the capacitance-to-current converter 301.

Figure 14:
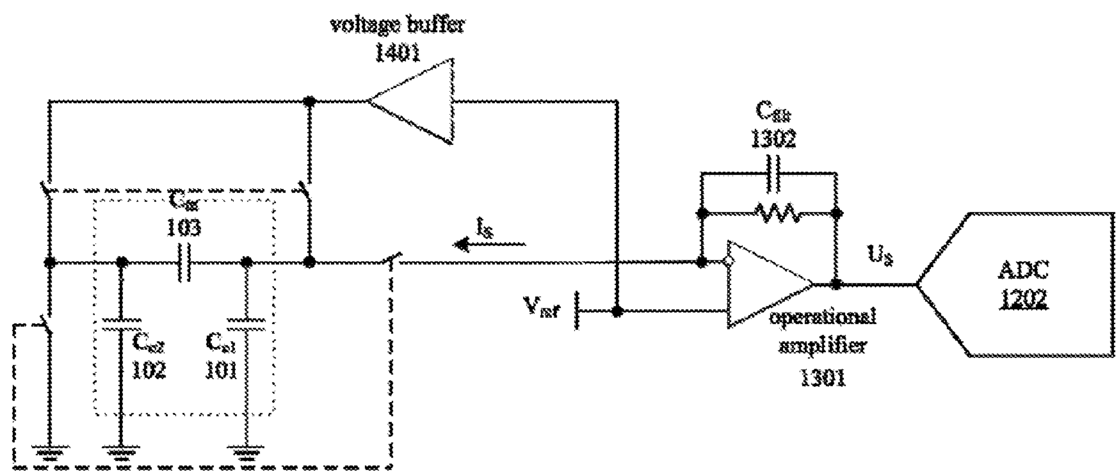
FIG. 14 illustrates one embodiment of a capacitance to current converter with a conversion circuit.

FIG. 13 illustrates one embodiment of a current-to-voltage converter built around an operational amplifier 1301. The converter of FIG. 13 also functions as a low pass filter (LPF) due to the presence of the filter capacitor $C_{filt}$ 1302 in the amplified feedback path. The output voltage $U_S$ is proportional to the input current $I_S$. The circuit of FIG. 13 operates continuously such that ADC conversion can be started any time after transient signals have stabilized. It should be noted that the buffer input inside the capacitance-to-code converter can be connected to the $V_{ref}$ net for the circuits illustrated in FIGS. 12 and 13, taking into account that both operational amplifier inputs have approximately the same potential. The schematic diagram of such a circuit configuration is illustrated in FIG. 14, where the input of voltage buffer 1401 is connected to the $V_{ref}$ net.

Figure 15:
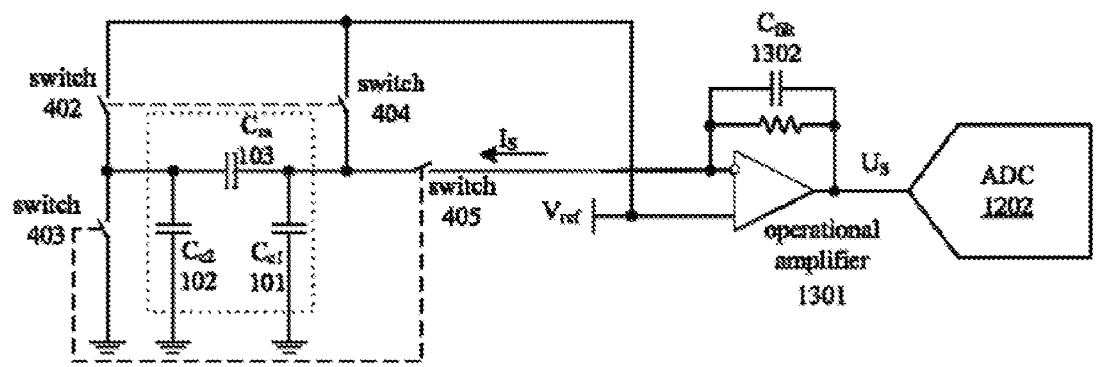
FIG. 15 illustrates one embodiment of a capacitance to current converter with a low-pass filter.

In an alternative embodiment, when the $V_{ref}$ voltage source has an acceptable low output resistance, then the voltage buffer 1401 may be eliminated from the circuits illustrated herein. As an example, the circuit from FIG. 4 composed of the measurement circuit of FIG. 13 is illustrated in FIG. 15. Accordingly, FIG. 15 is an example illustration of a capacitance-to-code converter with a low-pass filter that can be implemented without a voltage buffer 1401 coupled to the reference voltage source $V_{ref}$. In one embodiment, the reference voltage $V_{ref}$ used to supply the switches in the capacitance-to-current converter is selected to be as close to $V_{DD}$ as possible (limited by the working range of the operational amplifier 1301), to minimize the current flow out of $C_{e2}$ 102 relative to the current flowing through $C_m$ 103. In alternative embodiments, the switches in the converters can be supplied with other known voltages such as, for example, $V_{DD}$.

Figure 16:
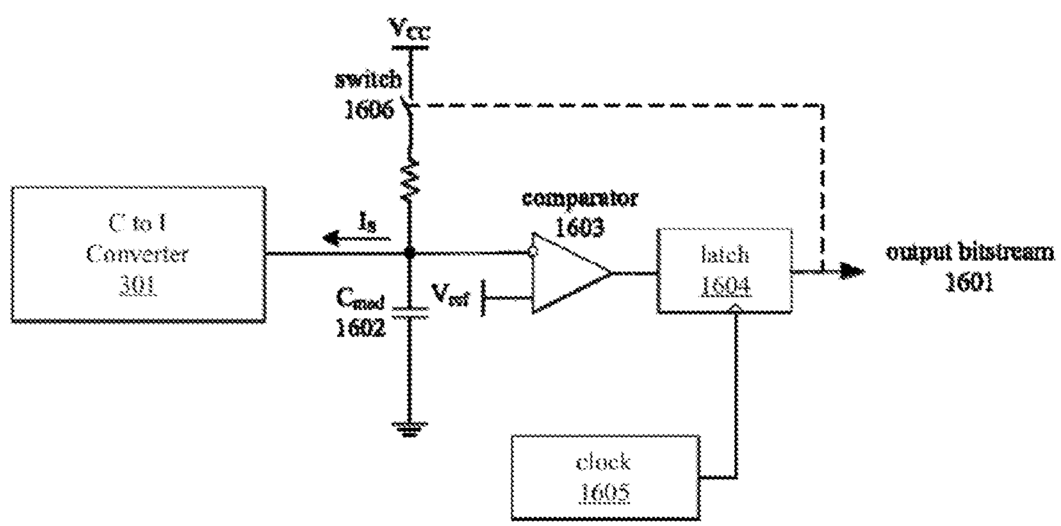
FIG. 16 illustrates one embodiment of a sigma-delta modulator configured as a capacitance to duty cycle converter.

The sigma-delta modulator circuits can be effectively used for the current-to-code conversion. An advantage of the sigma-delta modulator circuits is their integrative nature. FIG. 16 illustrates one possible example of a modulator implementation for a first order modulator. It should be noted that higher order modulator circuits can be used as well. The sigma-delta modulator of FIG. 16 converts the current $I_S$ to a code in output bitstream 1601. The current $I_S$ discharges modulation capacitor $C_{mod}$ 1602 until the voltage at $C_{mod}$ 1602 falls below $V_{ref}$, at which point comparator 1603 asserts its output to latch 1604, which outputs bits synchronously with a clock signal provided by clock 1605. The latch 1604 then closes switch 1606 to recharge $C_{mod}$ 1602 at a rate faster than it is being discharged by current $I_S$. When the voltage at $C_{mod}$ 1602 rises above $V_{ref}$, comparator 1603 de-asserts its output to latch 1604, which then opens synchronously to open switch 1606, allowing current $I_S$ to again discharge $C_{mod}$ 1602. This toggling of state of latch 1604 provides the bitstream 1601 which may then be evaluated to provide a digital-code equivalent of the measured capacitance.

Figure 17:
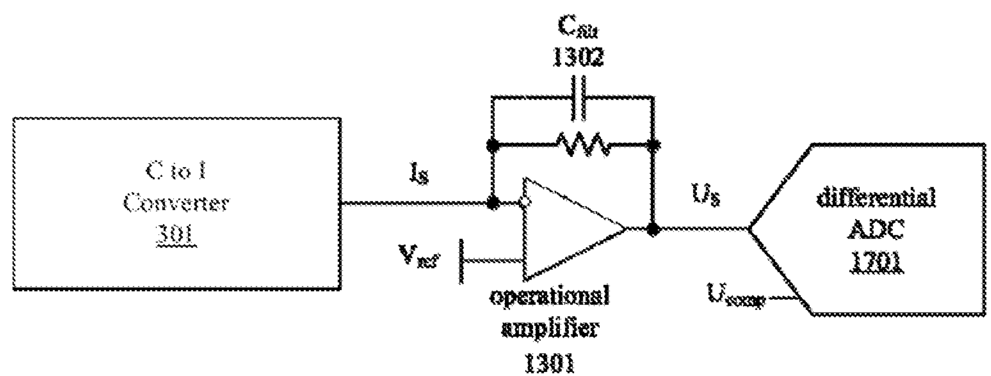
FIG. 17 illustrates one embodiment of a low pass filter with a differential analog to digital converter.

In one embodiment, the capacitance measurement circuit embodiments described previously may be used in touch sensitive devices. With such devices, a small capacitance change should be detected over the presence of large base capacitance. Such sensors have two components of capacitance, described in Equation 10:

$$C_S = C_{Sconst} + C_{Stouch} \quad (10)$$

where $C_{Sconst}$ is the capacitance of a sensor when touch is absent, and $C_{Stouch}$ is the change in capacitance caused by an input, such as a finger touch. The informative part of the sensor capacitance $C_S$ is the $C_{Stouch}$ component. In order to increase the resolution of the sensor, the particular compensation of the current generated by the $C_{Sconst}$ capacitance can be used. There are several possible implementations of this technique. In one embodiment, an ADC 1701 with differential inputs may be used as illustrated in FIG. 17. In the circuit of FIG. 17, the $U_{comp}$ voltage is supplied to the second input of ADC 1701.

Figure 18A:
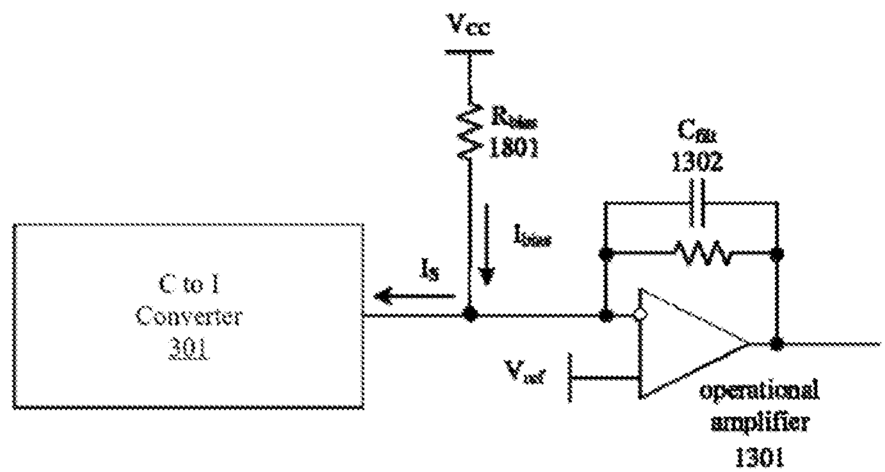
FIG. 18A illustrates base capacitance current compensation using a resistor as a current sink in a capacitance to current converter, according to one embodiment.
Figure 18B:
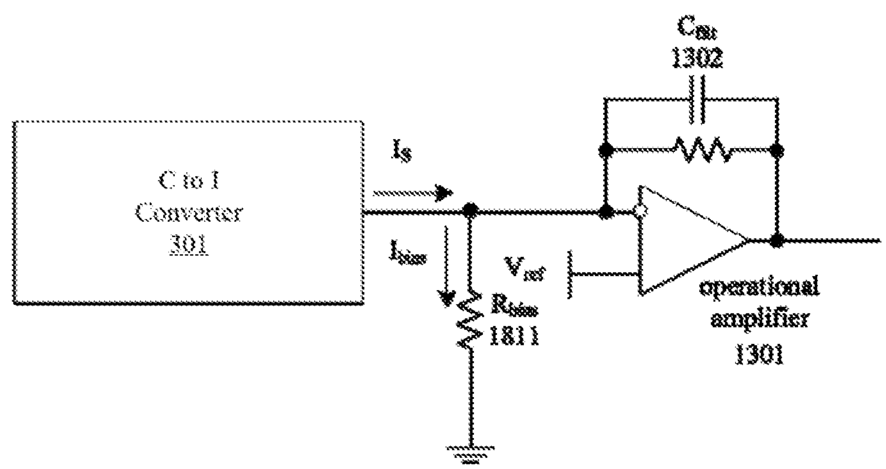
FIG. 18B illustrates base capacitance current compensation using a resistor for a current source in a capacitance to current converter, according to one embodiment.
Figure 19A:
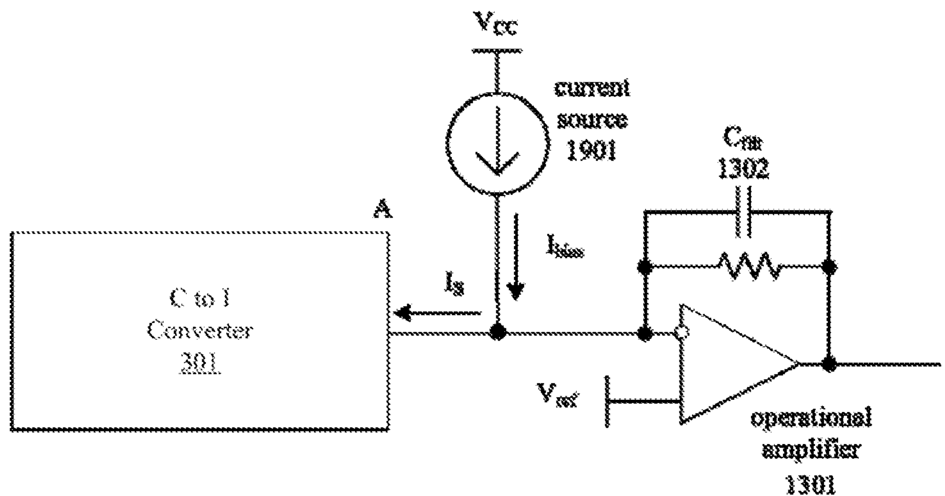
FIG. 19A illustrates base capacitance current compensation using a current source as a current sink in a capacitance to current converter, according to one embodiment.
Figure 19B:
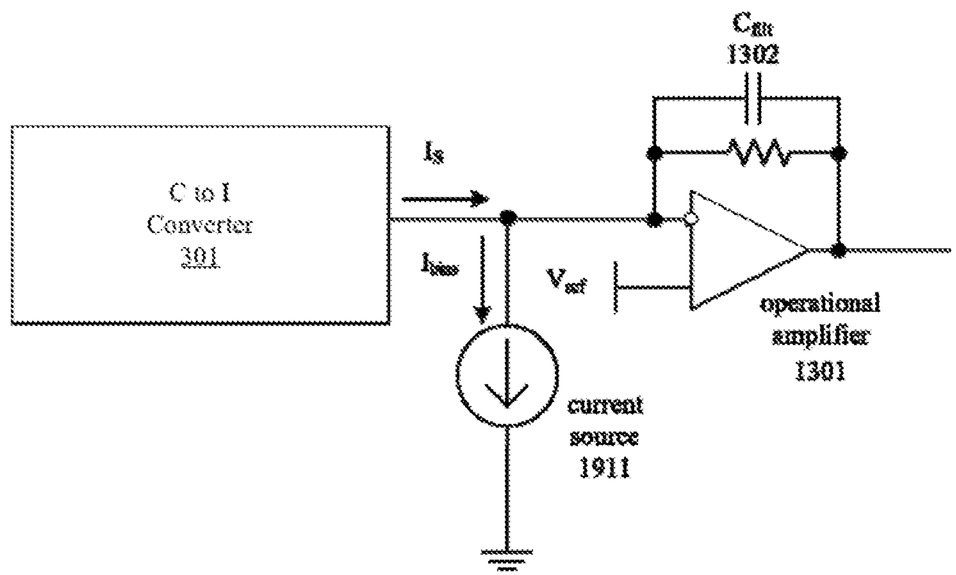
FIG. 19B illustrates base capacitance current compensation using a current source in a capacitance to current converter, according to one embodiment.

Alternative embodiments provide base-capacitance current compensation using a programmable current source or a resistor, as illustrated in FIGS. 18A, 18B, 19A, and 19B. More specifically, FIG. 18A illustrates base-capacitance current compensation using a resistor $R_{bias}$ 1801 as a current source in a capacitance-to-current converter, according to one embodiment. FIG. 18B illustrates base capacitance current compensation using a resistor $R_{bias}$ 1811 as a current sink in a capacitance-to-current converter, according to one embodiment. Current source 1901 and current source 1911 add and subtract current to and from the capacitance-to-current conversion circuits current onto $C_{int}$ 1302, respectively. FIG. 19A illustrates base-capacitance current compensation using a current source 1901 as a current sink in a capacitance-to-current converter, according to one embodiment. FIG. 19B illustrates base-capacitance current compensation using a current source 1911 in a capacitance-to-current converter, according to one embodiment. The $R_{bias}$ 1801 and $R_{bias}$ 1811 add and subtract current to and from the capacitance-to-current conversion circuits current onto $C_{int}$ 1302, respectively.

Figure 20A:
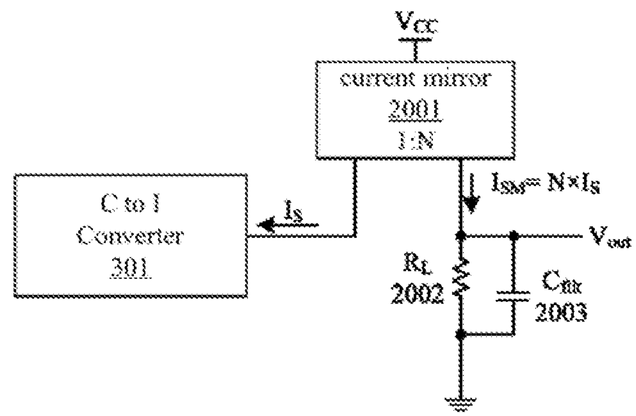
FIG. 20A illustrates using a current mirror with a voltage conversion system, according to one embodiment.
Figure 20B:
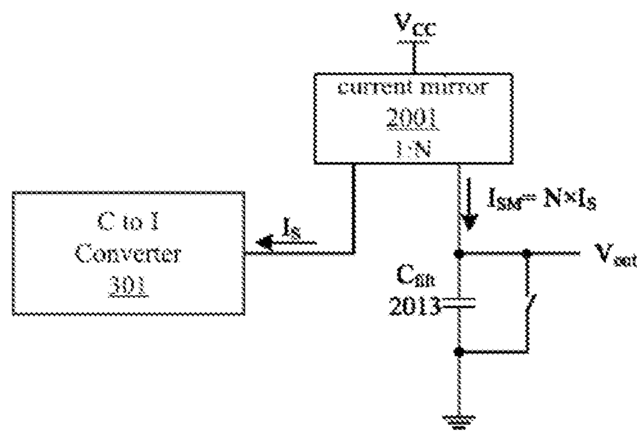
FIG. 20B illustrates using a current mirror with a current conversion system, according to one embodiment.
Figure 20C:
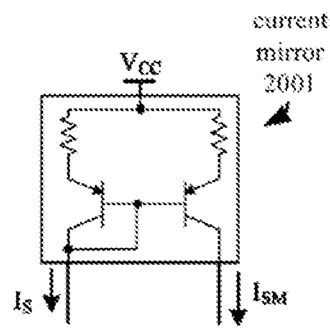
FIG. 20C illustrates one embodiment of a current mirror using a bipolar process technology.

FIGS. 20A, 20B, and 20C illustrate using a current mirror 2001 in the conversion circuits. FIG. 20A shows an example of a circuit for current-to-voltage conversion using a low-pass filter, formed by the combination of load resistance $R_L$ 2002 and filter capacitor $C_{filt}$ 2003. The current to voltage conversion is carrying out on the output of capacitance-tocurrent converter 301. A filter output voltage can be measured using an ADC, such as that shown FIG. 12 (element 1202). FIG. 20B illustrates a current-to-current conversion circuit. A current ($I_{SM}$) is sourced to the integration capacitor $C_{int}$ 2013 from current mirror 2001 which is coupled to and mirrors the current ($I_S$) of capacitance-to-current converter 301. The different circuits can be used for integration capacitor current measurement. In one embodiment, a current can be measured using a threshold comparator and a timer (not shown). In another embodiment, an integration capacitor voltage is measured using an ADC after running a capacitance-to-current operation within a predefined amount of time. The current mirror has low input impedance, which allows keeping a current mirror input pin voltage close to a constant voltage (e.g., $V_{DD}$). This embodiment may optimize the operating conditions of the capacitance-to-current conversion circuit, allowing the use of a voltage buffer with a smaller slew rate and reduced current consumption. Also, the current mirror serves as a current amplifier or attenuator, boosting or reducing the converter current by a factor of N. Many implementations of the current mirror circuit are possible, and one implementation using bipolar transistors is shown at FIG. 20C (element 2001). Equivalent circuits may be made with MOS, CMOS, and other circuit techniques.

Figure 21:
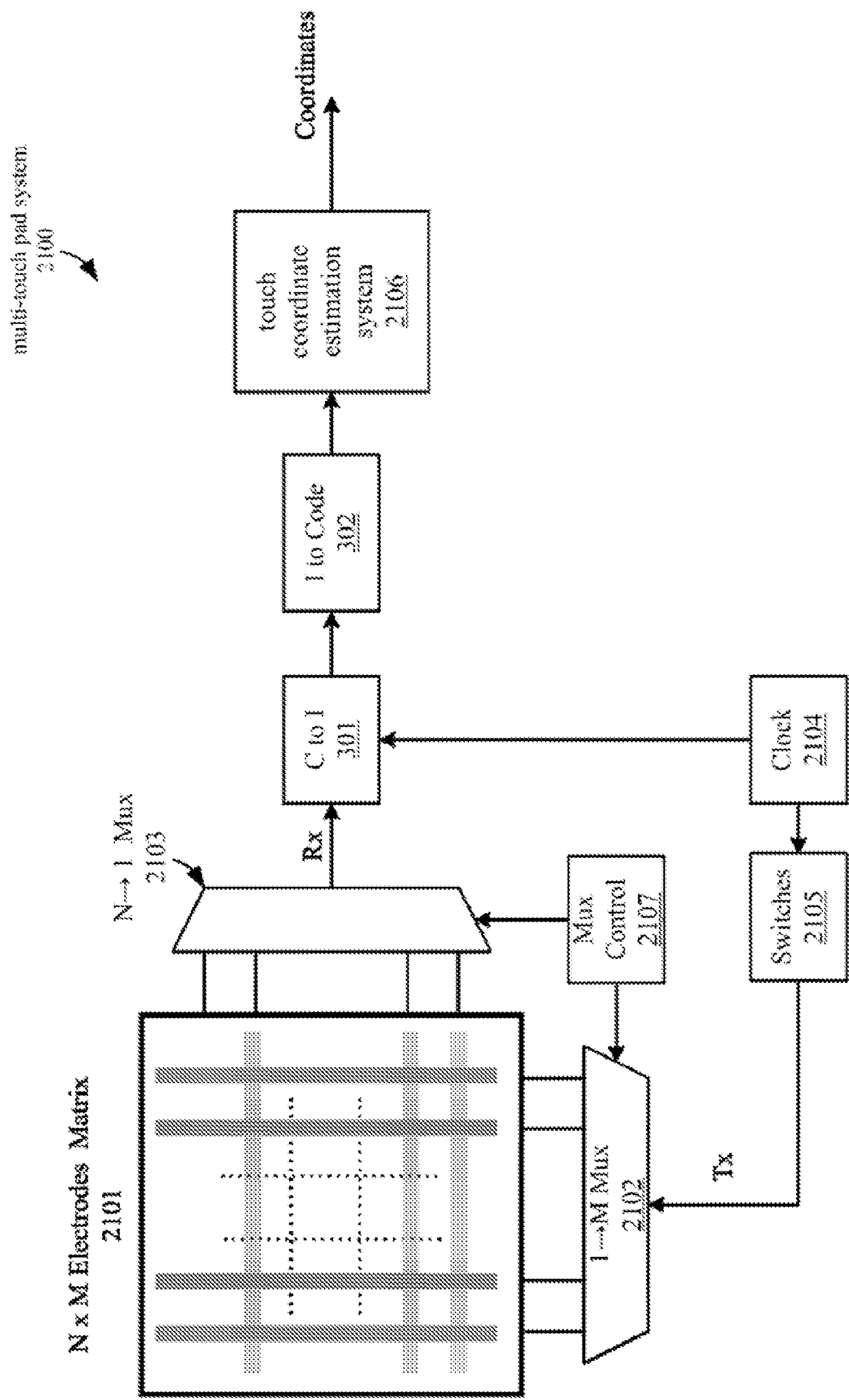
FIG. 21 illustrates one embodiment of a capacitance measurement circuit in a multi-touch touchpad system.

FIG. 21 illustrates a simplified schematic of a multi-touch touchpad system. The multi-touch touchpad system 2100 is composed of a dual dimension array (matrix) of electrodes 2101 coupled to column and row signal multiplexers 2102 and 2103. Multiplexor control 2107, clock source 2104, drive switches 2105 couple electrodes matrix 2101 to capacitance-to-current converter 301. Capacitance-to-current converter 301 is coupled to current-to-code converter 302. Current-to-code converter 302 is coupled to touch coordinate estimation system 2106. The electrodes matrix 2101 can be fabricated from any conductive material, as copper, conductive ink, Indium Tin Oxide (ITO), PEDOT, etc.

Figure 22:
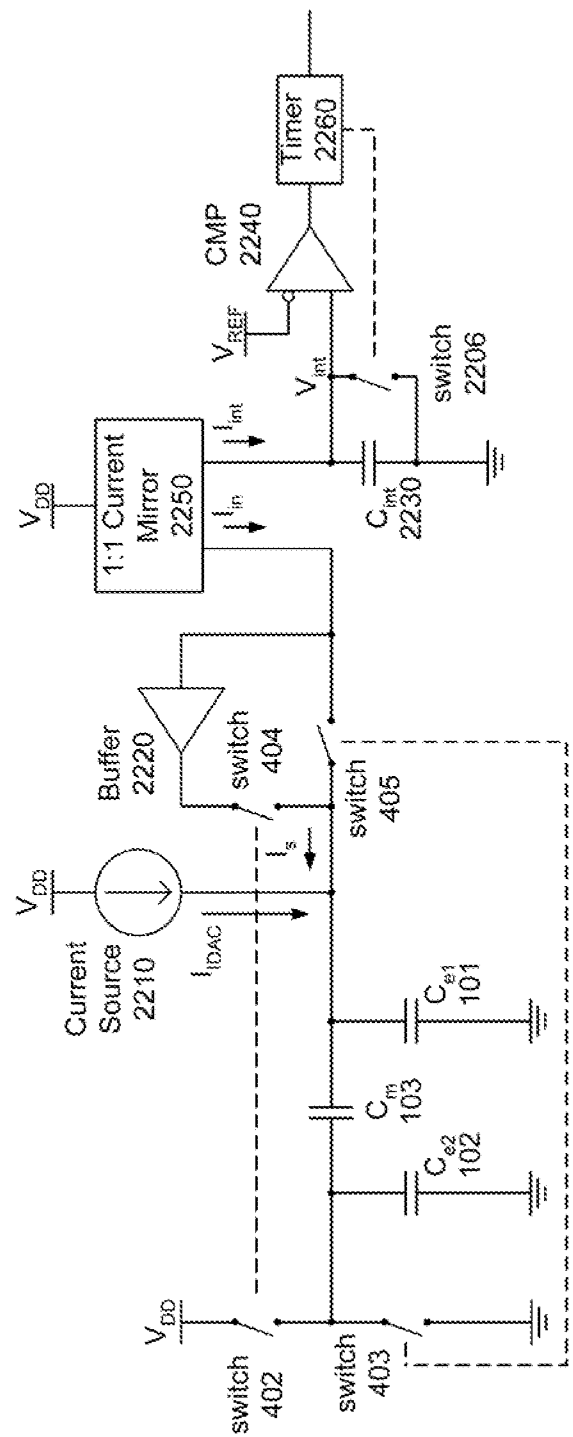
FIG. 22 illustrates one embodiment of a capacitance to current converter with a conversion circuit comprising a current mirror, an integration circuit and a timer.

FIG. 22 illustrates one embodiment of the capacitance-to-current converter comprising a current mirror 2250 and integration circuit ($C_{int}$ 2230, switch 2206 and CMP 2240) and a timer 2260.

Sensitivity and resolution of the capacitance measurement circuit are increased and the scan time is reduced with the addition of the compensating current Um generated by the programmable current supply IDAC 2210. The result summary current $I_{in}$ is generated and given by:

$$I_{in}=I_s-I_{IDAC} \tag{11}$$

Current mirror 2250 mirrors $I_{in}$ into $I_{int}$ with a transmission efficiency $K_1$=−1. A reset switch on current integrator capacitor $C_{int}$, along with a timer 2260 and a comparator CMP 2240, digitize the current from current mirror 2250. Before measurement, the voltage on capacitor $C_{int}$ 2230 is reset to a reset potential by reset switch 2206. During operation, charge integration on $C_{int}$ 2230 increases the voltage across $C_{int}$ 2230 as:

$$U_{Cint} = I_{int} \cdot \frac{t_{int}}{C_{int}} \tag{12}$$

The voltage across $C_{int}$, $U_{Cint}$, reaches a threshold $V_{ref}$ on the comparator CMP 2240 input, causing a hold on timer 2260 which is started at the beginning of the charge integration. The output of the timer is a digital representation of the non-compensated capacitance of $C_m$+$C_F$. (wherein $C_F$ is the change in $C_m$ caused by the presence of a finger or other conductive object). The full equation for the conversion of capacitance to current to counts is given by:

$$T_x = \frac{U_{Vref}}{K_1(f_{sw} \cdot U_{Vdd} \cdot C_m - I_{IDAC} - f_{sw} \cdot U_{Vdd} \cdot C_F)} \cdot C_{int} \tag{13}$$

This timer output signal may be used to operate reset switch 2206. In an alternate embodiment, integration capacitor reset switch 2206 may be operated by a state-machine or under control of a CPU executing instructions. Before measuring, the timer register's values are configured to initial values. The integration time may be sampled by a timer clock signal with a period of $$T_{ref} = \frac{1}{f_{ref}} \tag{14}$$

The result of the value of the clock frequency cycle number in one integration cycle of the measured current is given by:

$$N_x = \frac{T_x}{T_{ref}} \pm 1 \tag{15}$$

In the foregoing specification, the invention has been described with reference to specific embodiments thereof. It will, however, be evident that various modifications and changes may be made thereto without departing from the broader spirit and scope of embodiments of the invention.

What is claimed is:

1. A capacitance measurement circuit comprising:

a capacitance to current conversion circuit configured to operate in a self capacitance mode in a first operational state and configured to operate in a mutual capacitance mode in a second operational state; and a current to code conversion circuit configured to output a digital value representative of a current generated by the capacitance to current conversion circuit; wherein:

when the capacitance to current conversion circuit is configured to operate in the self capacitance mode, the capacitance to current conversion circuit comprises a sense capacitor between a first voltage potential and a plurality of switches, wherein the plurality of switches are configured to couple the sense capacitor alternately to a second voltage potential and to the current to code conversion circuit; and when the capacitance to current conversion circuit is configured to operate in the mutual capacitance mode, the capacitance to current conversion circuit comprises a sense capacitor between a first electrode and a second electrode, the first electrode is coupled to an alternating voltage signal, and the second electrode is coupled to the current to code conversion circuit.

2. The capacitance measurement circuit of claim 1, wherein the current to code conversion circuit comprises;

an analog-to-digital converter (ADC); and an integration capacitor coupled to the output of the capacitance to current conversion circuit and an input of the analog to digital converter at a first integration capacitor electrode and coupled to a fixed voltage potential at a second integration capacitor electrode.

3. The capacitance measurement circuit of claim 1, wherein the current to code conversion circuit comprises;

a comparator;

an integration capacitor coupled to the output of the capacitance to current conversion circuit and an input of the comparator at a first integration capacitor electrode and coupled to a fixed voltage potential at a second integration capacitor electrode; and a time measurement circuit coupled to the output of the comparator.

4. The capacitance measurement circuit of claim 1, wherein the current to code conversion circuit comprises:

a transimpedance amplifier (TIA) coupled to the output of the capacitance to current conversion circuit and to an analog-to-digital converter (ADC); and an integration capacitor coupled between an input and an output of the TIA.

5. The capacitance measurement circuit of claim 1, wherein the capacitance measurement circuit is configured to switch between the first operational state and the second operation state and the capacitance to current conversion circuit is configured for either self capacitance measurement or mutual capacitance measurement.

6. A capacitance sensing system comprising:

a first plurality of electrodes disposed along a first axis;

a second plurality of electrodes disposed along a second axis;

a capacitance to current conversion circuit coupled to the first plurality of electrodes and the second plurality of electrodes, the capacitance to current conversion circuit configured to operate in a self capacitance mode in a first operational state and configured to operate in a mutual capacitance mode in a second operational state; and a current to code conversion circuit, wherein the current to code conversion circuit is configured to output a digital value representative of a current generated by the capacitance to current conversion circuit; wherein:

when the capacitance to current conversion circuit is configured to operate in the self capacitance mode, the capacitance to current conversion circuit comprises a sense capacitor between a first voltage potential and a plurality of switches, wherein the plurality of switches are configured to couple the sense capacitor alternately to a second voltage potential and to the current to code conversion circuit; and when the capacitance to current conversion circuit is configured to operate in the mutual capacitance mode, the capacitance to current conversion circuit comprises a sense capacitor between a first electrode and a second electrode, the first electrode is coupled to an alternating voltage signal, and the second electrode is coupled to the current to code conversion circuit.

7. The capacitance sensing system of claim 6, wherein the capacitance to current conversion circuit, when configured to operate in the self capacitance mode, is coupled to at least one of the first or second pluralities of electrodes and is configured to convert the capacitance of the at least one of the first or second pluralities of electrodes to a current value.

8. The capacitance sensing system of claim 6, wherein the capacitance to current conversion circuit, when configure to operate in the mutual capacitance mode, is coupled to at least one of the first plurality of electrodes and at least one of the second plurality of electrodes and is configured to convert the mutual capacitance between the at least one of the first plurality of electrodes and the at least one of the second plurality of electrodes to a current value.

9. The capacitance sensing system of claim 6, wherein the capacitance to current conversion circuit, when configured to operate in the mutual capacitance mode, comprises:

a mutual capacitance between at least one of the first plurality of electrodes and at least one of the second plurality of electrodes;

a first plurality of switches configured to couple the at least one of the first plurality of electrodes to an output of a voltage buffer and to couple the at least one of the second plurality of electrodes to an input of the voltage buffer and to the current to code converter in non-overlapping phases; and a second plurality of switches configured to couple the at least one of the first plurality of electrodes to a fixed voltage potential and to couple the at least one of the second plurality of electrodes to the input of the voltage buffer and to the current to code converter in non-overlapping phases.

10. The capacitance sensing system of claim 6, wherein the first and second pluralities of electrodes are a sensitive portion of a touchscreen.

11. The capacitance sensing system of claim 6, wherein the capacitance sensing system is configured to detect a single conductive object in the first operational state and configured to detect multiple conductive objects in the second operational state.

12. A method of measuring capacitance, comprising:

at a capacitance sensing system having a first plurality of electrodes disposed along a first axis, a second plurality of electrodes disposed along a second axis, a capacitance to current conversion circuit coupled to the first plurality of electrodes and the second plurality of electrodes, and a current to code conversion circuit:

in a first operational state, configuring the capacitance to current conversion circuit to convert a self capacitance to a first current, wherein the current conversion circuit comprises a sense capacitor between a first voltage potential and a plurality of switches, and wherein the plurality of switches are configured to couple the sense capacitor alternately to a second voltage potential and to the current to code conversion circuit;

converting a self capacitance to the first current;

converting the first current to a digital value representative of the self capacitance;

in a second operational state, configuring the capacitance to current conversion circuit to convert a mutual capacitance to a second current, wherein the capacitance to current conversion circuit comprises a sense capacitor between a first electrode and a second electrode, the first electrode is coupled to an alternating voltage signal, and the second electrode is coupled to the current to code conversion circuit;

converting a mutual capacitance to the second current; and converting the second current to a digital value representative of the mutual capacitance.

13. The method of claim 12, wherein converting the self capacitance to the first current comprises:

coupling a capacitor to a first voltage potential in a first non-overlapping phase; and coupling a capacitor to a second voltage potential in a second non-overlapping phase.

14. The method of claim 12, wherein converting the mutual capacitance to the first current comprises:

coupling a first electrode to an alternative voltage signal; and coupling a second electrode to an integration capacitor.

15. The method of claim 12, wherein converting the mutual capacitance to the first current comprises:

accumulating charge on an integration capacitor;

generating a voltage potential across the integration capacitor; and converting the generated voltage potential across the integration capacitor to a digital value.

16. The method of claim 12, further comprising detecting a first conductive object in the first operational state and detecting a second conductive object in the second operational state.

* * * * *